United States Patent [19]
Shimizu et al.

[11] Patent Number: 6,060,740
[45] Date of Patent: May 9, 2000

[54] NON-VOLATILE SEMICONDUCTOR MEMORY DEVICE AND METHOD FOR MANUFACTURING THE SAME

[75] Inventors: Kazuhiro Shimizu; Seiichi Aritome, both of Yokohama; Kauhito Narita, Kawasaki, all of Japan

[73] Assignee: Kabushiki Kaisha Toshiba, Kawasaki, Japan

[21] Appl. No.: 09/044,112

[22] Filed: Mar. 19, 1998

[30] Foreign Application Priority Data

Mar. 21, 1997 [JP] Japan .................................. 9-068702

[51] Int. Cl.[7] ...................................................... H01L 29/76
[52] U.S. Cl. ......................... 257/314; 257/316; 257/332; 257/559
[58] Field of Search .................................. 257/314, 316, 257/332, 559

[56] References Cited

U.S. PATENT DOCUMENTS

| | | | |
|---|---|---|---|
| 5,619,051 | 4/1997 | Endo | 257/316 |
| 5,666,311 | 9/1997 | Mori | 438/257 |
| 5,693,971 | 12/1997 | Gonzalez | 257/314 |
| 5,858,839 | 1/1999 | Kaya et al. | 438/257 |

*Primary Examiner*—Sheila V. Clark
*Assistant Examiner*—H. D. Tran
*Attorney, Agent, or Firm*—Banner & Witcoff, Ltd.

[57] ABSTRACT

The non-volatile semiconductor memory device is formed on a silicon substrate and comprises a plurality of semiconductor active regions defined by a plurality of element isolation regions, a source region and a drain region formed in each of the semiconductor active regions, a charge storage layer which capacitively couples to the semiconductor active region between the source region and the drain region, and a control gate which capacitively couples to the charge storage layer through a second gate insulation film, wherein the second gate insulation film is left extending from the upper surface portion of the element isolation region which lies under the control gate to the upper surface portion of the element isolation region other than the upper surface portion of the element isolation region lying under the control gate.

19 Claims, 26 Drawing Sheets

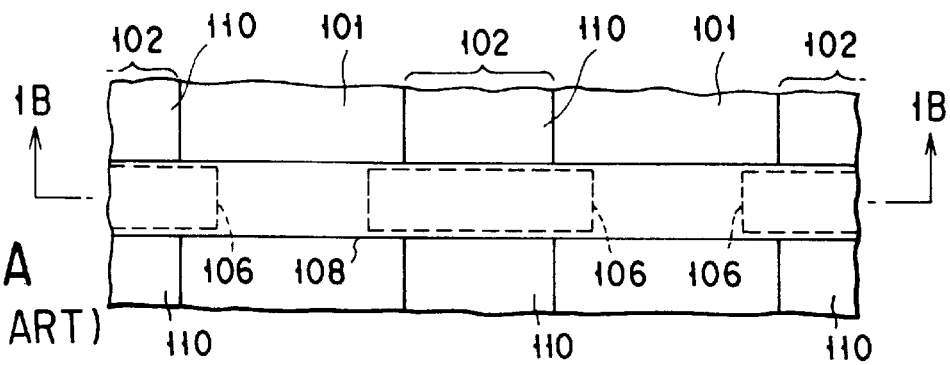
FIG. 1A (PRIOR ART)
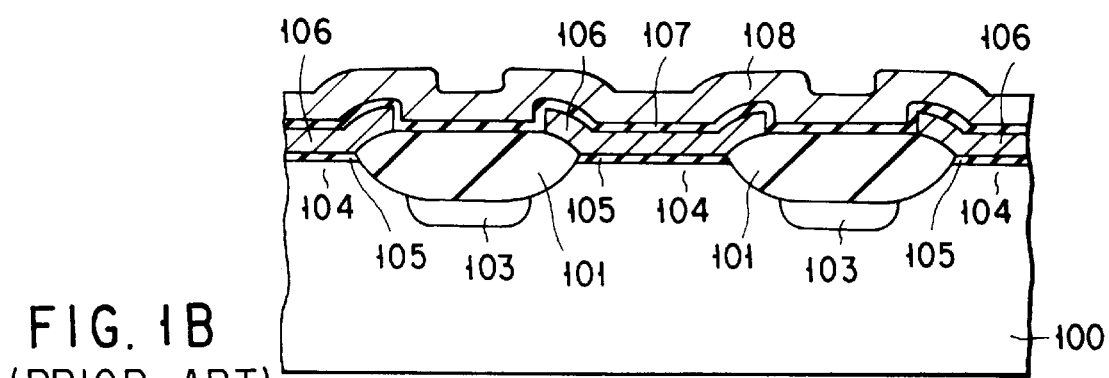
FIG. 1B (PRIOR ART)
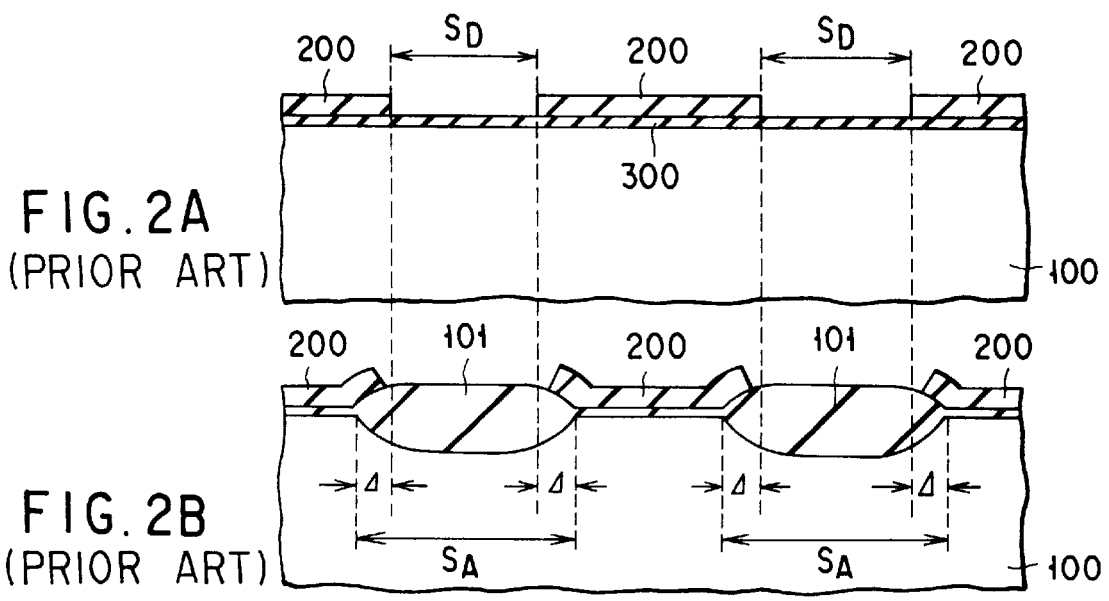
FIG. 2A (PRIOR ART)
FIG. 2B (PRIOR ART)

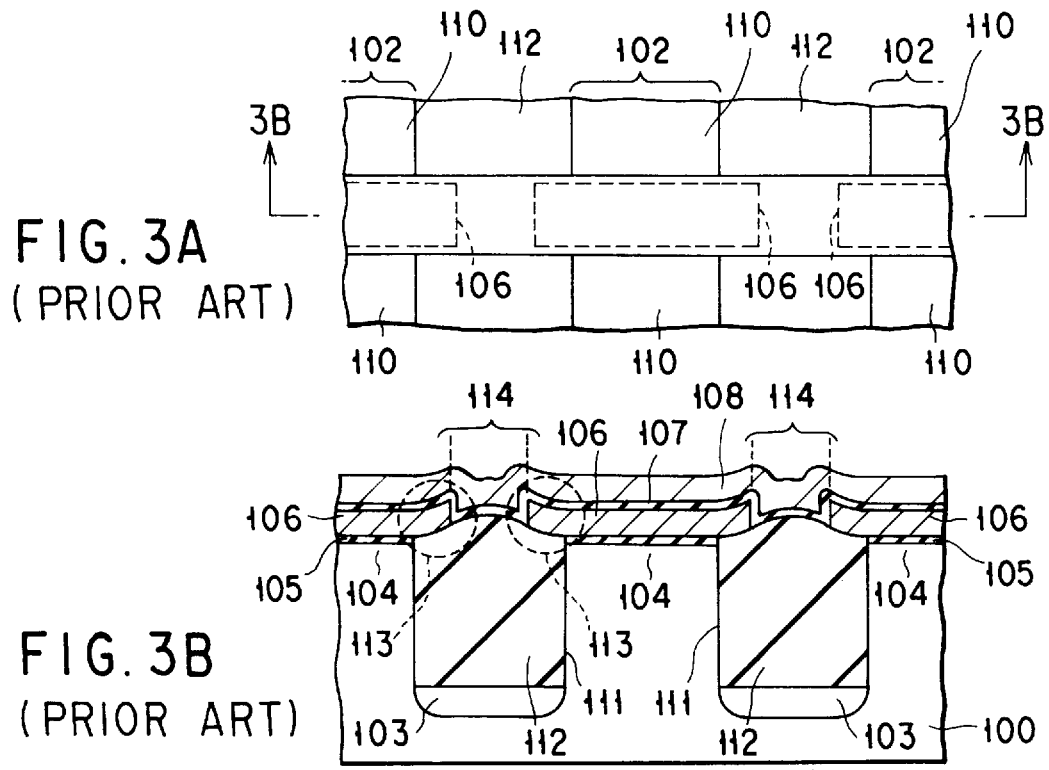
FIG. 3A (PRIOR ART)
FIG. 3B (PRIOR ART)
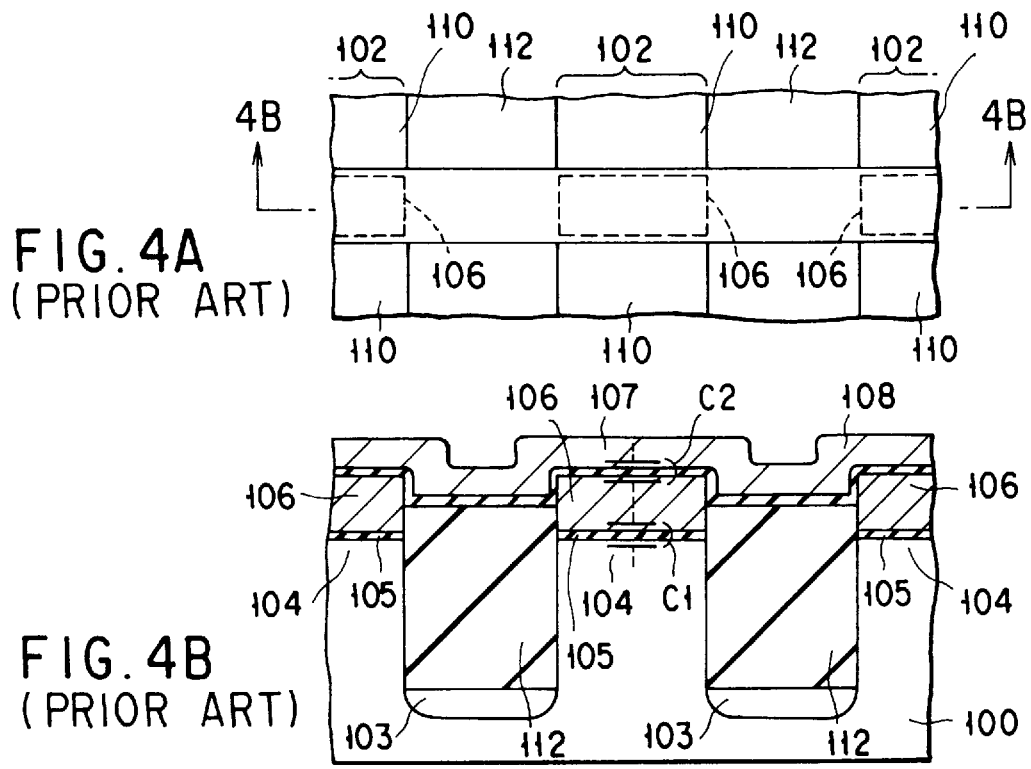
FIG. 4A (PRIOR ART)
FIG. 4B (PRIOR ART)

ROW DIRECTION ← → COLUMN DIRECTION

NON-VOLATILE SEMICONDUCTOR MEMORY DEVICE AND METHOD FOR MANUFACTURING THE SAME

BACKGROUND OF THE INVENTION

The present invention relates to a non-volatile semiconductor memory device and a method for manufacturing the same and, particularly, an improvement in or relating to the manufacturing step of forming the laminated gate structure thereof.

An EEPROM is a kind of non-volatile semiconductor memory device in which data can be electrically rewritten or reloadable and, known as such a memory device is an MOS transistor which comprises a laminated gate structure consisting of a charge storage layer (floating gate) and a control gate.

FIG. 1A is a plan view showing the memory cells of an FETMOS type EEPROM which is one type of EEPROM, and FIG. 1B is a sectional view taken along the line 1B—1B in FIG. 1A.

As shown FIGS. 1A and 1B, on a p-type silicon substrate (or a p-type well) 100, there is formed a thermally oxidized oxide or thermal oxide film ($SiO_2$) constituting element isolation regions. The element isolation regions 101 define element regions 102 in the surface of the substrate 100. In the portion of the substrate 100 which lies under the element isolation regions 101, p+ type channel stoppers 103 are formed. In the element regions 102, n+ type source and drain regions 110 are formed. The portion of the respective element region 102 which lies between the source and drain regions 110 constitutes a channel region 104. Formed on the channel region 104 is a thin oxide film ($SiO_2$) 105 through which a tunnel current can be made to flow. The oxide film 105 is a gate insulation film. On the oxide film 105, a floating gate 106, an inter-layer insulation film 107 and a control gate 108 are successively formed. The inter-layer insulation film 107 insulates the floating gate 106 and the control gate from each other and, at the same time, capacitively couple said control gate 108 and said floating gate 105 to each other. Due to this, the inter-layer insulation film 107 is formed of, e.g. silicon dioxide or a so-called ONO (oxide-nitride-oxide) film formed by successively laminating silicon dioxide, silicon nitride and silicon dioxide one upon another. Further, the laminated gate structure consisting of the floating gate 106, the inter-layer insulation film 107 and the control gate 108 is formed in a continuous patterning manner using a photo resist mask (not shown) patterned into a control gate pattern. Due to this, the edges of the floating gate 106 and the edges of the control gate 108 are matched with each other. The source and drain regions 110 are formed by injecting an n-type impurity into the substrate 100 by means of ion implantation, using as a mask the laminated gate structure and the element isolation regions 101, respectively.

In the case of the memory cells shown in FIGS. 1A and 1B, used for the element isolation regions 101 is a thermally oxidized oxide film or thermal oxide film formed by the use of the LOCOS (Local Oxidation Of Silicon) method. FIGS. 2A and 2B show typical manufacturing process according to the LOCOS method.

As shown in FIG. 2A, according to the LOCOS method, a nitride film ($Si_3N_4$) 200 is formed in the surface portions of the substrate 100 other than the surface portions of the substrate 100 in which the element isolation regions are formed. After this, as shown in FIG. 2B, the surface of the substrate 100 is thermally oxidized to a considerable thickness. Since the nitride film 200 functions as a barrier film against oxidation, the thermal oxide film ($SiO_2$) is formed on the (surface) portions of the surface of the substrate 100 which are not covered by the nitride film 200. The thermal oxide film thus formed constitutes the element isolation regions 101. Further, in FIG. 2A, the reference numeral 300 denotes a buffer oxide film.

In the case of the LOCOS method, as is well known, wedge-shaped oxide films known as "bird's beaks" in the respective interface between the nitride film 200 and the substrate 100. The bird's beaks result in causing a conversion error between the designed structure and the actually completed structure. Due to this, each element isolation region 101, that is, the actual width dimension $S_A$ of the element isolation region 101 becomes larger by, e.g. an amount corresponding to the conversion error than the designed width dimension $S_D$. According to the LOCOS method which has such a defect, it is very difficult to form each element isolation region 101 the smallest width of which is 0.5 μm or less.

Further, in the case of employing the LOCOS method, the portion of the thermal oxide film which is formed in the interior of the substrate 100 is only about half of the whole thickness thereof. Due to this, the element isolating ability exhibited in the interior of the substrate 100 is scanty, and it is also difficult to narrow the interval for element isolation.

Further, the remaining portion of the thermal oxide film comes out to the surface of the substrate 100, so that, in the surface of the substrate, "differences in level" are caused. The "differences in level" thus caused in the surface of the substrate 100 results in lowering the processing margin in the lithography step, so that even the formation of fine patterns are made difficult.

As an element isolation technique for overcoming such a difficulty, the trench element isolation technique has come to be developed according to which trenches are formed in the substrate, and the interiors of the trenches are filled up with an insulation material.

FIG. 3A is a plan view of the memory cell of an FETMOS type EEPROM formed by the use of the trench element isolation technique, and FIG. 3B is a sectional view taken along the line 3B—3B in FIG. 3A. In FIGS. 3A and 3B, the portions corresponding to those shown in FIGS. 1A and 1B are referenced by the same reference numerals for omission of the description thereof and for giving a description of only different portions.

As shown in FIGS. 3A and 3B, in a substrate 100, trenches 111 for element isolation are formed. The interiors of the trenches 111 are filled with an element isolating insulation material such as, e.g. silicon dioxide, whereby trench type element isolation regions 112 are formed.

In the trench type element isolation regions 112, no bird's beak is produced; and thus, no conversion error exists between the designed structure and the actually completed structure.

Further, in the case of the respective trench type element isolation region 112, the portion thereof which is formed in the interior of the substrate 100 can be determined depending on the depth of the trench 111, so that element isolation regions formed deeply in the interior of the substrate can be realized. As a result, the element isolation ability can be enhanced; and the interval required for isolation of the elements from each other can be more reduced than in the case of the element isolation regions formed in accordance with the LOCOS method. Due to this, the interval for element isolation can be decreased to a substantial degree. In this way, by introducing the trench element isolation technique, the miniaturization of the element isolation regions becomes possible.

However, in the case of the memory cells of an EEPROM, there is another structural portion which is an obstacle to the miniaturization. That is "wings" 113 of each floating gate 106. The "wings" 113 are formed in a state extended onto the element isolation regions. Due to the fact that the floating gates 106 have the "wings" 113, the mutually opposed areas of each floating gate 106 and the associated control gate 108 spread, so that the capacitance between the floating gate 106 and the control gate 108 increases. However, the design-wise minimum dimension is restricted by the distance between the "wings" 113, that is, the dimension of a "slit" 114 for separating the floating gates 106 from each other, so that the merit due to the trench element isolation technique is belittled.

Further, the respective floating gate 106 must be formed on the channel region 104 without fail. For instance, if the mask shifts out of position, so that the edge of the particular floating gate 106 comes to be disposed on the channel region 104, then, when the laminated gate structure is formed by etching, even the element region 102 be etched. Due to such circumstances, it must be ensured that the amount of mismatch or positional shift of the mask in the lithographic step must be made smaller than the width of the "wing" 113.

For instance, in case the trench type element isolation region 112 is formed with a width of 0.4 μm, and the "slit" 114 is formed with a width of 0.2 μm, the width of the "wing" 113 becomes 0.1 μm. In this case, the amount of positional shift or mismatch of the mask in the lithographic step must be held down to 0.1 μm or less. Accordingly, in the case of the memory cells shown in FIGS. 3A and 3B, it is considered that a further miniaturization thereof is very difficult.

The technique according to which the miniaturization of the element isolation regions and the miniaturization of the memory cells can be achieved at the same time was reported by Aridome et al. in the IEDM in 1994; that is, the so-called "self-aligning trench element isolation technique".

FIG. 4A is a plan view of the memory cells of an FETMOS type EEPROM formed by the use of the self-aligning trench element isolation technique, and FIG. 4B is a sectional view taken along the line 4B—4B in FIG. 4A. In FIGS. 4A and 4B, the portions corresponding to those shown in FIGS. 1A and 1B are referenced by the same reference numerals for omission of the description thereof, and only the different portions will be described.

As shown in FIGS. 4A and 4B, trench type element isolation regions 112 is formed in a state self-aligning with the side walls of the floating gates 106. Due to this, the floating gates 106 have no "wing". Due to the fact that the floating gates 106 have no "wing", the memory cells can be more miniaturized than the memory cells shown in FIGS. 3A and 3B.

In the case of the FETMOS type EEPROM, as shown in FIG. 4B, a voltage VCG applied to the control gate 108 is divided by the capacitance C1 constituted through the gate oxide film 105 between the floating gate 106 and the channel 104 and the capacitance C2 constituted through the interlayer insulation film 107 between the floating gate 106 and the control gate 108. The voltage VFG effectively applied to the capacitance C1 is represented as follows:

$$VFG=\{C2/(C1+C2)\}\cdot VCG.$$

In the case of the FETMOS type EEPROM, the capacitance C2 is increased in order to reduce the voltage VCG applied to the control gate at the time of writing or erasure through the FN tunneling (Fowler-Nordheim tunneling). Here, the "wings" turn out to be an important element. In the memory cells shown in FIGS. 4A and 4B, no "wing" exists, but a portion of the side wall of each floating gate 106 is exposed from the element isolation region 112, so that, in this exposed portion, the floating gate 106 and the control gate 108 are opposed to each other to increase the capacitance C2.

FIGS. 5 to 13 are, respectively, perspective views showing the manufacturing steps for the manufacture of an FETMOS type EEPROM by the use of the self-aligning trench element isolation technique. In FIGS. 5 to 13, the pattern of an NOR type EEPROM is shown by way of example.

First, as shown in FIG. 5, a gate oxide film 105 is formed in the surface of a p-type silicon substrate (or a p-type well) 100. Next, on the thus formed gate oxide film 105, silicon is deposited to form a polycrystalline silicon film 106 which is used as a floating gate later. Further, on this polycrystalline silicon film 106, silicon nitride ($Si_3N_4$) is deposited to form a silicon nitride film 201 which is used as a mask later. Subsequently, the portions of the silicon nitride film 201 which lie on the regions which will be used as the trench type element isolation regions later are etched. Then, by the use of the silicon nitride film 201 as a mask, the polycrystalline silicon film 106 and the gate oxide film 105 are anisotropically etched. Subsequently, the substrate 100 is anisotropically etched to form trenches 111. Then, after the side walls of the trenches 111 are subjected to a washing treatment, a thin insulation film such as, e.g. a thin thermal oxide film ($SiO_2$) (not shown) is formed on said side walls. Further, in order to enhance the threshold voltage and the punch-through voltage of the parasitic MOSFET constituted in the portion of the substrate 100 which lies beneath each trench 111, boron is injected by ion implantation into the substrate 100 from the bottom of the respective trench 111, whereby a channel stopper 103 is formed. The channel stoppers 103 may be formed as required. The depth of the trenches 111 can be suitably selected by taking into consideration the threshold voltage of the parasitic MOSFET formed in the portion of the substrate 100 lying beneath each trench 111 and the punch-through voltage.

Next, as shown in FIG. 6, an insulating material such as TEOS or BPSG is deposited, whereby the trenches 111 and the openings formed in the laminated structure consisting of the gate oxide film 105, the polycrystalline silicon film 106, and the nitride film 201 are filled up with burying or burying members 112. Then, by the use of the chemical-mechanical polishing (CMP) method or the etch-back method, the surfaces of the burying or filling members 112 thus deposited are flattened.

Subsequently, as shown in FIG. 7, the surface portions of the polycrystalline silicon film 106 are exposed, and the surfaces of the buried members 112 and the surface portions of the polycrystalline silicon film 106 are further flattened so that said surfaces may positionally coincide with one another. Then, the buried members 112 are further dry-etched or wet-etched, whereby the side walls of the polycrystalline silicon film 106 are exposed. The height of the thus exposed side walls is determined depending on the area necessary to obtain a desired capacitance C2 as described above. Subsequently, the thus exposed side walls of the polycrystalline silicon film 106 are washed.

Next, as shown in FIG. 8, on the buried members 112 and the polycrystalline silicon film 106, a silicon oxide film ($SiO_2$), a silicon nitride film ($Si_2N_4$) and a silicon oxide film (SiO$_2$) are successively laminated, thus forming a laminated ONO film 107 which will be used later as an inter-layer insulation film for insulating the floating gate and the control gate from each other. Then, on the laminated ONO film 107, polycrystalline silicon is deposited to form an electrically conductive polycrystalline silicon film 108 which will be used later as a control gate is formed. In this case, the surface of the polycrystalline silicon film 108 has differences in level in the portions lying on the respective buried members 112 since the surfaces of the buried members 112 recede from the surface of the polycrystalline silicon film 106.

Subsequently, as shown in FIG. 9, on the polycrystalline silicon film 108, a photo resist is applied, forming a photo resist layer 202. Then, the photo resist layer 202 is patterned into control gate patterns by the use of the lithography method. Next, by the use of the photo resist layers 202 as a mask, the portion of the polycrystalline silicon film 108 other than the portions thereof which will be rendered into the control gates is completely removed by anisotropic etching until the ONO film 107 comes to be exposed; and thus, said first-mentioned portion is wholly removed.

Next, as shown in FIG. 10, the ONO film 107 is anisotropically etched, in which case the buried members 112 lying under the ONO film 107 are also etched, so that the surfaces of the buried members 112 partially recede, thus causing a "film decrease or loss". In FIG. 10, the original surfaces of the buried members 112 are shown by a broken line.

Next, as shown in FIG. 11, the polycrystalline silicon film 106 is anisotropically etched. As a result, the polycrystalline silicon film 106 is separated from memory to memory, thus assuming its shape as the floating gate 106. At the same time, the ONO film 107 assumes its shape as the inter-layer insulation film 107 which insulates the floating gate 106 and the control gate 108 from each other, and the polycrystalline silicon film 108 assumes its shape as the control gate 108 of the memory cell. In this way, the laminated gate structures 203 each consisting of the control gate 108, the inter-layer insulation film 107 and the floating gate 106 are completed. Further, the buried members 112 assume their shape as the trench type element isolation regions 112.

Next, as shown in FIG. 12, after or before the photo resist layer 202 is removed, a donor impurity such as phosphorus is injected into the substrate 100 by ion implantation to form source regions 110S and drain regions 110D by the use of the laminated gate structures 203 and the element isolation regions 112.

Next, as shown in FIG. 13, there is formed an inter-layer insulation film 204 which is buried in to fill up the portions between the laminated gate structures 203 to insulate said laminated gate structures 203 from each other; in the inter-layer insulation film 204, contact holes 205 leading to the drain regions formed; and, on each inter-layer insulation film 204, there are formed bit lines 206 which are electrically connected to the drain regions 110D through the contact holes 205, with which the memory cells of the EEPROM are completed.

However, in the case of the above-mentioned processing method and memory cell structure, as is apparent particularly from FIG. 10, the surfaces of the buried members 112 are partially exposed, and thus, there is the fear that they may be exposed to the etching treatment etc. and thus shaven off in the ensuing steps. Due to this, there is the further fear that the fine "voids" produced when the trenches 111 are filled up with the buried members 112 may spread to deteriorate the element isolation ability; and further, on the surfaces of the completed trench type element isolation regions 112, "differences in level" are produced, as a result of which there is caused the fear that, when the inter-layer insulation film 204 is buried in, an "insufficient burying-in" may be caused due to said "differences in level".

Further, as shown in FIG. 11, in case the surfaces of the buried members 112 largely recede, the element regions (the semiconductor substrate 100) are exposed, so that, when the polycrystalline silicon film 106 is being etched, the substrate 100 may be etched at the same time.

The "film decrease or loss" of the surfaces of the element isolation regions results in the deterioration in electrical characteristics of the memory cell array of the EEPROM due to the "insufficient burying-in" etc. as mentioned above or causes an unnecessary etching of the element regions in some cases. This in turn brings about inconvenient circumstances such as, e.g the fall in yield of EEPROMs.

Further, the "film decrease or loss" of the surfaces of the element isolation regions is a phenomenon which takes place not only in the case of the above-mentioned self-aligning trench isolation technique but also in the case of any product having laminated gate type memory cells such as an EEPROM which has a LOCOS type element isolation regions as shown in FIGS. 1A and 1B or an EEPROM which has a trench type element isolation regions as shown in FIGS. 3A and 3B.

BRIEF SUMMARY OF THE INVENTION

It is the object of the present invention to provide a non-volatile semiconductor memory device in which the surfaces of the element isolation regions are free from "film decrease or loss" and a method for the manufacture of the non-volatile semiconductor memory device.

In order to achieve the above-mentioned object, the non-volatile semiconductor memory device according to a first aspect of the present invention comprises a semiconductor substrate, a plurality of semiconductor active regions formed, in the semiconductor substrate, in a state isolated from each other, a plurality of element isolation regions which are formed between the plurality of semiconductor active regions, respectively, a source region and a drain region formed in a state isolated from each other, the source region and the drain region being each formed in each of the plurality of semiconductor active regions, a first gate insulation film formed on a corresponding one of the plurality of semiconductor active regions between the source region and the drain region, a charge storage layer which capacitively couples, through the first gate insulation film, to the corresponding one of the plurality of semiconductor active regions between the source region and the drain region, a second gate insulation film formed at least on the charge storage layer, and a control gate which capacitively couples to the charge storage layer through the second gate insulation film, wherein the control gate extends, above a predetermined number of the semiconductor active regions adjacent to each other, over corresponding regions of the plurality of element isolation regions, and the second gate insulation film formed on the charge storage layer is formed in a state extending from an upper surface of a corresponding one of the plurality of element isolation regions lying under the control gate to an upper surface of the corresponding one of the plurality of element isolation regions other than the upper surface of the corresponding one of the plurality of element isolation regions lying under the control gate.

According to the present invention, the second control gate insulation film is formed extending not only over the upper surface but also over the upper surface an element isolation region other than the upper surface of the element isolation region lying under the control gate. Particularly, the second gate insulation film formed over the upper surface of the element isolation region other than that lying under the control gate serves to protect the surface of the element isolation region from the etching at the time of processing the control gate and the floating gate (i.e., the charge storage layer). Accordingly, in the case of the non-volatile semiconductor memory device according to the present invention, the "film decrease or loss" which otherwise would be caused in the surface of the element isolation regions can be suppressed.

Further, according to the present invention, the element isolation regions are each desirably a trench type element isolation region. If the element isolation regions are constituted in a form of trench type element isolation regions, then the miniaturization of the element isolation regions can be realized. Further, there can be obtained effects such as the effect that the inconvenience that the "voids" produced at the time of filling up the trenches may spread in the later steps can be avoided, so that non-volatile semiconductor memory devices having fine element isolation regions can be manufactured at a good yield.

A position of the upper surface of each of the plurality of element isolation regions is located at a position lower than an upper surface of the charge storage layer which lies above the corresponding one of the plurality of element active regions and higher than an interface between the charge storage layer and the first gate insulation film.

Since the upper surface of the respective element isolation region lies at a position higher than the interface between the charge storage layer and the first gate insulation film, so that the face of the semiconductor active region which face lies along the depth direction of the substrate is not exposed from the element isolation region. Due to this, the face of the semiconductor active region which face lies along the depth direction of the substrate is protected by the element isolation region so as not to be etched at the time of processing the control gate and the floating gate. Therefore, defects such as, e.g. the "reduction in area of the semiconductor active region" are not caused.

A surface of the control gate extending above the predetermined number of the semiconductor active regions is desirably flattened.

Or, the control gate may comprise a laminated structure formed of a first electrically conductive layer composed of a first electrically conductive material and of a second electrically conductive layer composed of a second electrically conductive material having a resistance lower than that of the first electrically conductive material, wherein a surface of the first electrically conductive layer is flattened.

A non-volatile semiconductor memory device according to the present invention may further comprise:

a plurality of diffused regions formed in the plurality of semiconductor active regions, respectively, and an electrode layer extending, on a predetermined number of the diffused regions adjacent to each other, over corresponding regions of the plurality of element isolation regions, and electrically connecting the predetermined number of the diffused regions with each other, and wherein the second gate insulation film is formed between the corresponding one of the plurality of element isolation regions and the electrode layer.

The above electrode layer constitutes a source line.

Since the surface of the respective control gate (or the first conductive member) is flattened, so that the thickness of the portion of the control gate (or the first conductive member) extending above the element isolation region becomes larger than the thickness of the portion of the control gate (or the first conductive member) extending above the floating gate. This structure allows the control gate or the first conductive material constituting the control gate to be easily left on the element isolation region at the time of processing the floating gate and the control gate. For instance, if the first conductive material constituting the control gate is left on the element isolation region, then, by the use of the thus left first conductive material as a mask, the second gate insulation film can be etched. This structure overcomes the conventional problem or defect that, when the second insulation film is etched, the element isolation region is over-etched.

Further, since the surface of the first conductive material or member is flattened, another conductive member of a low resistance lower than that of the first conductive member can be easily laminated. Thus, by laminating, on the first conductive member, a second conductive member of a resistance lower than that of the first conductive member, the resistance value of the control gate is further lowered. The control gate with its resistance value thus further lowered is useful for the formation of a fine non-volatile semiconductor memory device in which memory cells are integrated on a large scale.

The non-volatile semiconductor memory device according to a second aspect of the present invention comprises a semiconductor substrate, a plurality of semiconductor active regions formed, in the semiconductor substrate, in a state isolated from each other, a plurality of element isolation regions which are formed between the plurality of semiconductor active regions, respectively, a source region and a drain region formed in a state isolated from each other, the source region and the drain region being each formed in each of the plurality of semiconductor active regions, a first gate insulation film formed on a corresponding one of the plurality of semiconductor active regions between the source region and the drain region, a charge storage layer which capacitively couples, through the first gate insulation film, to the corresponding one of the plurality of semiconductor active regions between the source region and the drain region, a second gate insulation film formed at least on the charge storage layer, and a control gate which capacitively couples to the charge storage layer through the second gate insulation film, the control gate extending, above a predetermined number of the semiconductor active regions adjacent to each other, over corresponding regions of the plurality of element isolation regions, wherein, with reference to an upper surface of a corresponding one of the plurality of element isolation regions, a following relationship holds among a height "Ha" of a portion of the upper surface excluding a portion thereof lying beneath the control gate, a height "Hb" of a portion of the upper surface which lies beneath the control gate, and a thickness "Tc" of the second gate insulation film:

Hb−Ha<Tc

In the case of the above-mentioned semiconductor memory device, the difference between the thickness of that portion of the element isolation region which lies below each control gate and the thickness of that portion of the element isolation region which lies between the control gates is held down to less than the thickness "Tc", of the second gate insulation film; in other words, the "film decrease or loss" caused of the surface of the respective element isolation region is held down to less than the thickness "Tc" of the second gate insulation film. If the "film decrease or loss" is below the thickness "Tc" of the second gate insulation film, then it is within the practically permissible range.

Further, in the above-mentioned semiconductor memory device, the element isolation regions can be rendered into trench type element isolation regions.

If the respective element isolation region is rendered into a trench type element isolation region, then a miniaturization of the element isolation region can be realized. By application of the second aspect of the present invention to a non-volatile semiconductor memory device having trench type element isolation regions, it is ensured to obtain effects such as the effect that, even if no second gate insulation film is provided on the upper surface of the respective trench type element isolation region unlike in the case of the first aspect of the present invention, non-volatile semiconductor memory devices having fine element isolation regions can be manufactured at a high yield as in the case of the first aspect of the present invention.

Further, as for a position of the upper surface of each of the plurality of element isolation regions, the upper surface is desirably located at a position lower than an upper surface of the charge storage layer which lies above the corresponding one of the plurality of element active regions and higher than an interface between the charge storage layer and the first gate insulation film.

By so constructing, this non-volatile semiconductor memory device can achieve the same working effects as in the case of the first aspect of the present invention.

Further, a surface of the control gate extending above the predetermined number of the semiconductor active regions is desirably flattened.

Further, the control gate can comprise a laminated structure formed of a first electrically conductive layer composed of a first electrically conductive material and a second eclectically conductive layer composed of a second electrically conductive material having a resistance lower than that of the first electrically conductive material, wherein a surface of the first conductive layer is flattened.

By constructing the non-volatile semiconductor memory device as mentioned above, working effects similar to those of the first aspect of the present invention can be obtained.

The method for manufacturing a non-volatile semiconductor memory device according to a third aspect of the present invention comprises the steps of:

forming a laminated structure composed by successively laminating a first gate insulation film and a first electrically conductive layer on a semiconductor substrate, selectively forming a plurality of opening portions in the laminated structure in order to define element formation regions in the semiconductor substrate, forming a plurality of element isolation layers in the plurality of opening portions, respectively, forming a second gate insulation film extending from an upper surface of each of the plurality of element isolation layers to a surface of the laminated structure, forming a second electrically conductive layer on the second gate insulation film, removing the second electrically conductive layer at least above an upper surface of the first electrically conductive layer, and at the same time, leaving the second electrically conductive layer above each of the plurality of element isolation layers, by retreating a portion of the second electrically conductive layer other than a region thereof in which a control gate is intended to be formed, retreating the second gate insulation film by use, as a mask, of at least the second electrically conductive layer left above the plurality of element isolation layers, whereby at least the upper surface of the first electrically conductive layer is exposed, and retreating the first and the second electrically conductive layer and forming a plurality of laminated gate structures which each include a charge storage portion comprising the first electrically conductive layer, the control gate comprising the second electrically conductive layer, and the second gate insulation film which causes the charge storage portion and the control gate to capacitively couple to each other.

According to the above-described invention, the portion of the second conductive layer other than the region thereof in which the control gate is intended to be formed is retreated, the second conductive layer is removed from at least the upper surface of the first conductive layer and, at the same time, left above the element isolation regions. Thereafter, by the use of the left portions of the second conductive layer as a mask, the second gate insulation film is made to recede or retreated to expose at least the upper surface of the first conductive layer. After this, the first and second conductive layers are made to recede, and a laminated gate structure including a charge storage portion comprising the first conductive layer, a control gate comprising the second conductive layer, and the second gate insulation film which capacitively couples the charge storage portion and the control gate to each other is formed. The method according to the third aspect comprises the above-mentioned steps, whereby the surfaces of the respective element isolation regions are protected by the second conductive layer or the second gate insulation film during the formation of the laminated gate structure. Thus, the laminated gate structure can be formed, suppressing the occurrence of a "film decrease or loss" in the surfaces of the respective element isolation regions.

The step of forming a plurality of element isolation layers can include the steps of:

forming trenches in portions of the semiconductor substrate which are exposed to the plurality of opening portions of the laminated structures, filling up the trenches and the opening portions in the laminated structures with an electrically insulating material which constitutes the element isolation layers, and retreating an upper surface of the insulating material so that side walls of the first electrically conductive layer included in the laminated structure may be exposed.

According to the above-described invention, the trench type element isolation regions can be formed in a state self-aligning to the side faces of the first conductive layer which will be become a floating gate later. According to such a manufacturing method, the occurrence of "film decrease or loss" which otherwise would be caused in the surface of the trench type element isolation regions can be suppressed.

Further, the step of forming a second conductive layer can include the steps of:

depositing, on the second gate insulation film, a conductive material which constitutes the second conductive layer later, and flattening a surface of the conductive material which is deposited.

According to the above-described invention, the surface of the electrically conductive material deposited is flattened, so that the thickness of the electrically conductive material above the respective element isolation regions can be larger than the thickness of the conductive material above the first conductive layer. As a result, the electrically conductive material can be easily left above the element isolation regions.

Further, the step of forming a second conductive layer can include the steps of:

depositing, on the second gate insulation film, a first electrically conductive material which constitutes the second electrically conductive layer, flattening a surface of the first electrically conductive material which is deposited, and depositing, on the first electrically conductive material which is flattened, a second electrically conductive material which constitutes the second electrically conductive layer.

According to the above-mentioned invention, the surface of the first conductive material deposited is flattened, so that the thickness of the first electrically conductive material above the element isolation regions can be larger than the thickness of the first electrically conductive material above the first conductive layer. Due to this, the first electrically conductive material can be easily left above the respective element isolation region. Further, since the surface of the first electrically conductive material is flattened, the second electrically conductive material is uniformly deposited on the surface of the first electrically conductive material. Due to this, the other electrically conductive materials can be easily made to recede.

Further, the step of removing the second electrically conductive layer at least above an upper surface of the first electrically conductive layer and, at the same time, leaving the second electrically conductive layer above each of the element isolation layers can include the steps of:

removing the second electrically conductive layer at least above the upper surface of the first electrically conductive layer, and at the same time, leaving at least a part of the first electrically conductive material above the element isolation layers, by retreating a portion of the second electrically conductive layer other than a region thereof in which the control gate is intended to be formed.

According to the above-described invention, the surface of the first conductive material deposited is flattened, so that the thickness of the first conductive material above the respective element isolation region can be made larger than the thickness of the first conductive material above the first conductive layer. Further, the surface of the first electrically conductive material is flattened, so that the second electrically conductive material is uniformly deposited on the surface of the first electrically conductive material. Due to this, it is easy to make the second conductive material recede, and thus, above the respective element isolation regions, only the first electrically conductive material can be easily left.

Further, the method for manufacturing a non-volatile semiconductor memory device according to a fourth aspect of the present invention comprises the steps of:

forming a first electrically conductive layer, through a first gate insulation film, above a semiconductor substrate having a plurality of element isolation regions, the first electrically conductive layer having a plurality of slits provided on the plurality of element isolation regions, respectively, forming a second gate insulation film extending from an upper surfaces of the plurality of element isolation regions to a surface of the first electrically conductive layer, forming a second electrically conductive layer on the second gate insulation film, retreating a portion of the second electrically conductive layer other than a portion thereof which becomes a control gate, so that the second electrically conductive layer is removed at lest above an upper surface of the first electrically conductive layer and, at the same time, left in the plurality of slits, and retreating the second gate insulation film by use, as a mask, of at least portions of the second electrically conductive layer left in the plurality of slits to remove the second gate insulation film on the upper surface of the first electrically conductive layer, and retreating the first electrically conductive layer and the portions of the second electrically conductive layer left in the slits to form a control gate and a charge storage layer.

According to the above-described invention, the portion of the second electrically conductive layer other than the region in which the control gate is intended to be formed, whereby the second conductive layer is removed from at least the upper surface of the first conductive layer and, at the same time, left in the slits formed in the first conductive layer. Further, by the use, as a mask, of the portion of the second conductive layer left in the slits, the second gate insulation film is retreated, whereby the second gate insulation film is removed from at least the upper surface of the first conductive layer. Moreover, the first conductive layer and the portion of second conductive layer left in the slits are retreated, whereby the charge storage layer is formed together with the control gate. Since the control gate and the charge storage layer are formed, the surface of the respective element isolation region is protected by the second electrically conductive layer or the second gate insulation film. Due to this, the control gate and the charge storage layer can be formed under suppression of the occurrence of a "film decrease or loss" in the surface of the respective element isolation region.

In the method for manufacturing a non-volatile semiconductor memory device according to the fourth aspect of the present invention, the step of forming a first electrically conductive layer includes the steps of:

forming, on the semiconductor substrate, a laminated structure composed by successively laminating the first gate insulation film and the first electrically conductive layer, selectively forming, in the laminated structure, a plurality of first stripe-shaped opening portions which become the plurality of slits, and etching portions of the semiconductor substrate which are exposed in the plurality of first opening portions to form a plurality of stripe-shaped trenches, and forming the plurality of element isolation regions which fill up the plurality of strip-shaped trenches and partially fill up each of the plurality of first opening portions in such a manner that upper side-faces of the first electrically conductive layer exposed in the plurality of first opening portions are exposed;

the step of retreating a portion of the second electrically conductive layer includes the steps of:

retreating a portion of the second electrically conductive layer other than a region thereof in which a plurality of laminated gate structures, which each includes the control gate and the charge storage layer, are intended to be formed, so that the second electrically conductive layer is removed at least above the upper surface of the first electrically conductive layer and, at the same time, left above the plurality of element isolation regions;

the step of retreating the second gate insulation film and retreating the first electrically conductive layer and the portions of the second electrically conductive layer to form the control gate and the charge storage layer includes the steps of:

retreating the second gate insulation film by use, as a mask, of at least portions of the second electrically conductive layer left above the plurality of element isolation regions to thereby expose at least an upper surface of the first electrically conductive layer, and retreating the first and the second electrically conductive layer and forming the plurality of laminated gate structures extending in a direction different from that of the plurality of stripe-shaped trenches, the method for manufacturing a non-volatile semiconductor memory device further includes the steps of:

forming a plurality of semiconductor regions, which function as source and drain regions, in the semiconductor substrate by use of the laminated gate structures and the element isolation layers as a mask, forming an inter-layer insulation film which insulates the plurality of laminated gate structures from each other, and forming a second stripe-shaped opening portion in the inter-layer insulation film between the plurality of laminated gate structures by use, as a mask, of at least portions of the second gate insulation film left above the plurality of element isolation regions, the second stripe-shaped opening portion extending along the plurality of laminated gate structures and exposing the plurality of semiconductor regions, which function as the source and drain regions.

According to the above-described invention, the second gate insulation film is left on the element isolation regions, so that, even if, in the inter-layer insulation film between the laminated gate structures, a stripe-shaped opening portion is formed which (opening portion) extends along the laminated gate structures and exposes the semiconductor regions which function as the source and drain regions, the element isolation regions exposed in the interior of the opening portion can be prevented from being subjected to "film decrease or loss". Due to this, the deterioration of the insulation between the interior of the opening portion and the semiconductor substrate portions in the element isolation regions is suppressed.

The second stripe-shaped opening portion is an opening portion for forming a buried electrode which connects corresponding semiconductor regions to each other along a corresponding one of the plurality of laminated gate structures, the semiconductor regions functioning as the source regions separated from each other by the plurality of element isolation regions.

According to the above-described invention, there can be provided an example of the concrete use of the stripe-shaped opening portion which is formed in the inter-layer insulation film between the laminated gate structures in a state extending along the laminated gate structures and exposes the semiconductor regions, which function as the source and drain regions, and the element isolation regions. That is, the source regions which are divided or separated by the stripe-shaped element isolation regions can be connected to each other by forming a buried electrode in the stripe-shaped opening portion. The buried electrode formed in the stripe-shaped opening portion extends, passing above the element isolation regions in the opening portion, but, since the "film decrease or loss" of the element isolation regions is suppressed, the insulation between the semiconductor substrate and the buried electrodes in the element isolation regions is sufficiently secured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view of the memory cells of a conventional EEPROM;

FIG. 1B is a sectional view taken along the line 1B—1B in FIG. 1A;

FIGS. 2A and 2B are, respectively, sectional views used for explaining the problematic point of the LOCOS method, of which FIG. 2A is a sectional view explaining the design value (SD) of the isolation regions, while FIG. 2B is a sectional view explaining the actual value (SA) of the isolation regions;

FIG. 3A is a plan view showing the memory cells of a different conventional EEPROM;

FIG. 3B is a sectional view taken along the line 3B—3B in FIG. 3A;

FIG. 4A is a plan view of the memory cells of a conventional EEPROM based on the self-aligning trench element isolation technique;

FIG. 4B is a sectional view taken along the line 4B—4B in FIG. 4A;

DETAILED DESCRIPTION OF THE INVENTION

Embodiments of the present invention will now be described by reference to the drawings.
(First Embodiment)

FIGS. 14 to 23 are, respectively, perspective views which show the steps of manufacturing the memory cells of a FETMOS type EEPROM by the use of the self-aligning trench element isolation technique according to an embodiment of the present invention. In these FIGS. 14 to 23, the pattern of an NOR type EEPROM is shown by way of example.

Figure 5:
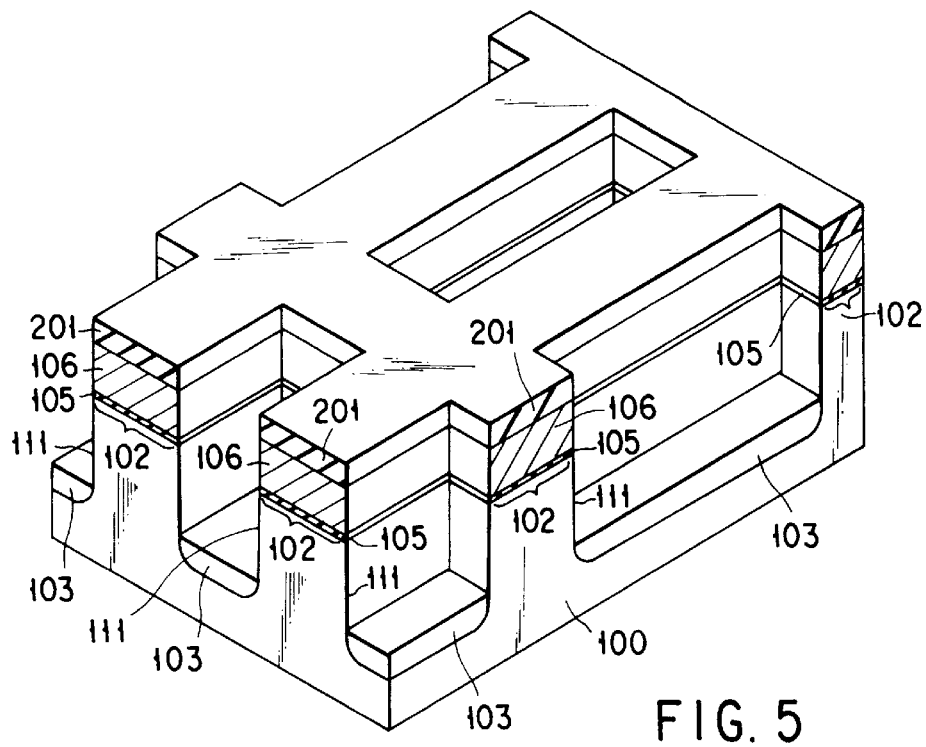
FIGS. 5 to 13 are, respectively, perspective views which show in due order the conventional EEPROM manufacturing steps employing the self-aligning trench element isolation technique.
Figure 6:
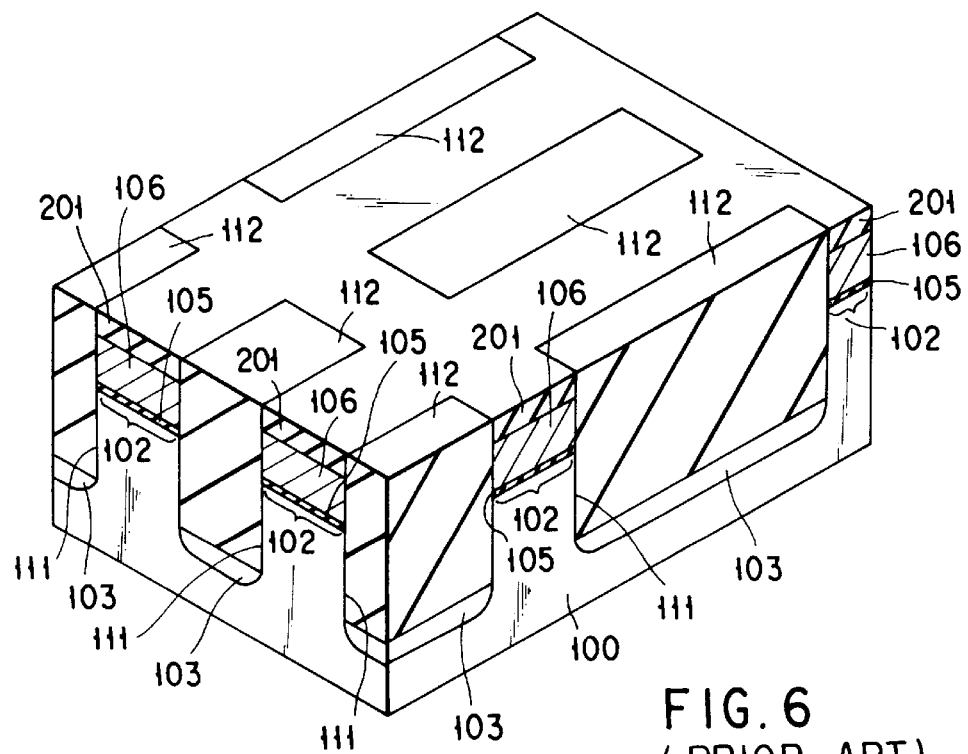
Figure 7:
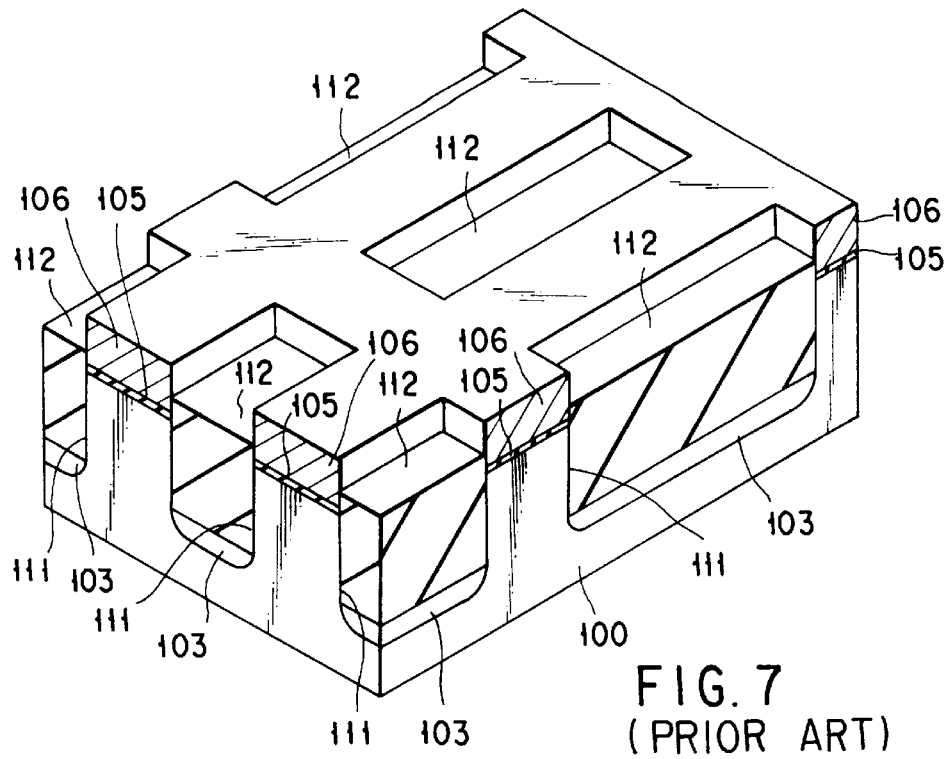
Figure 8:
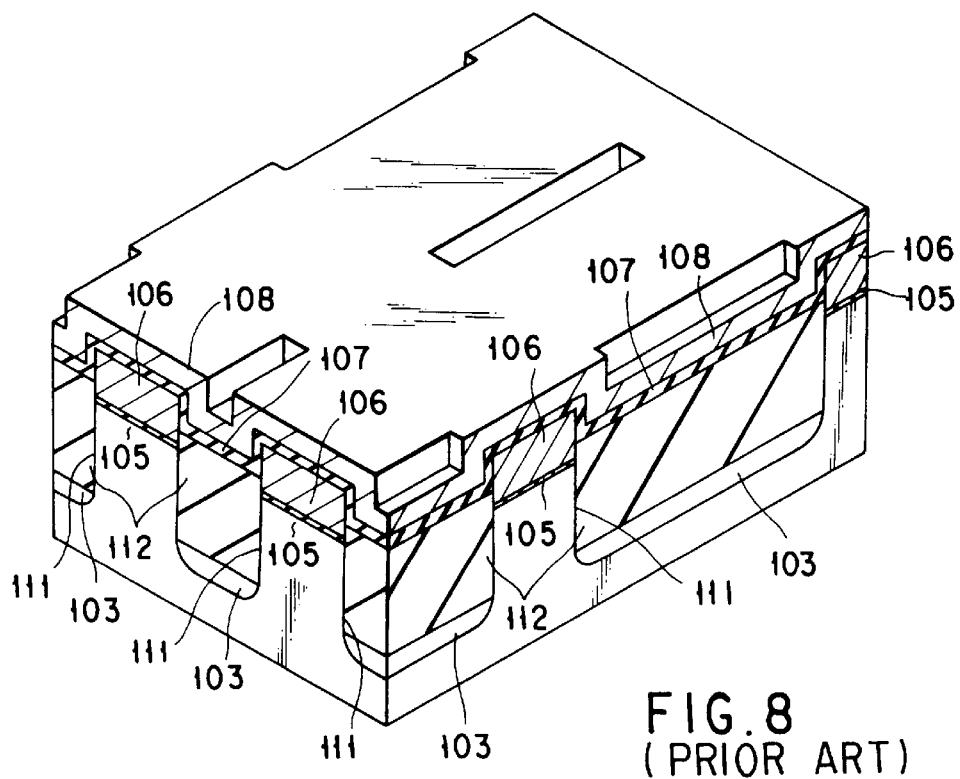
Figure 9:
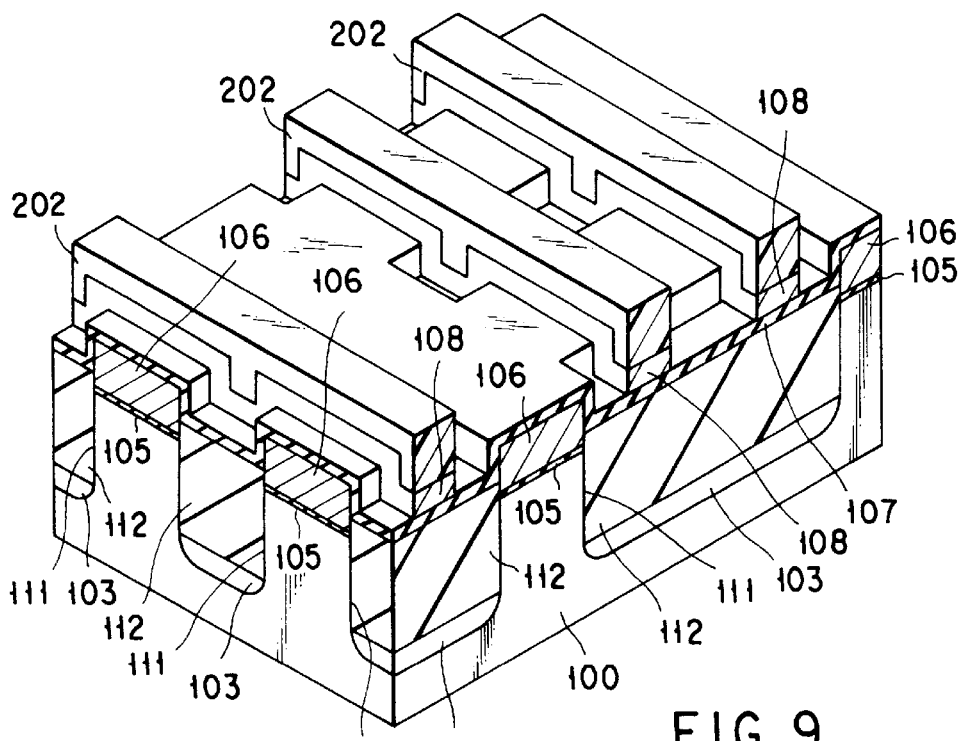
Figure 10:
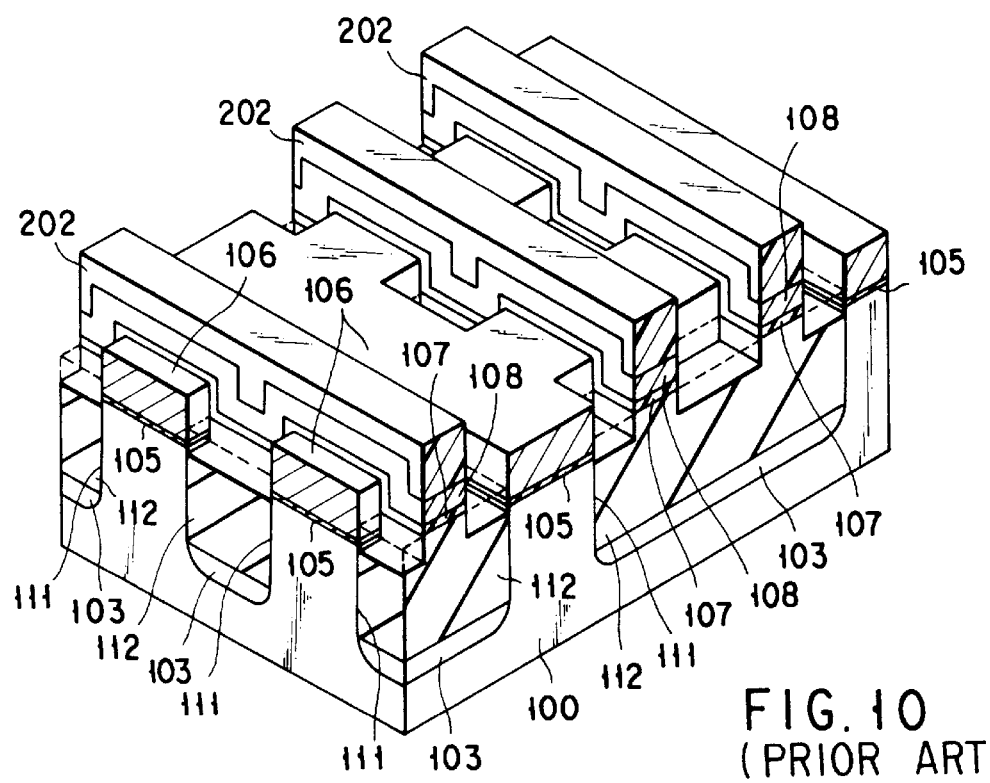
Figure 11:
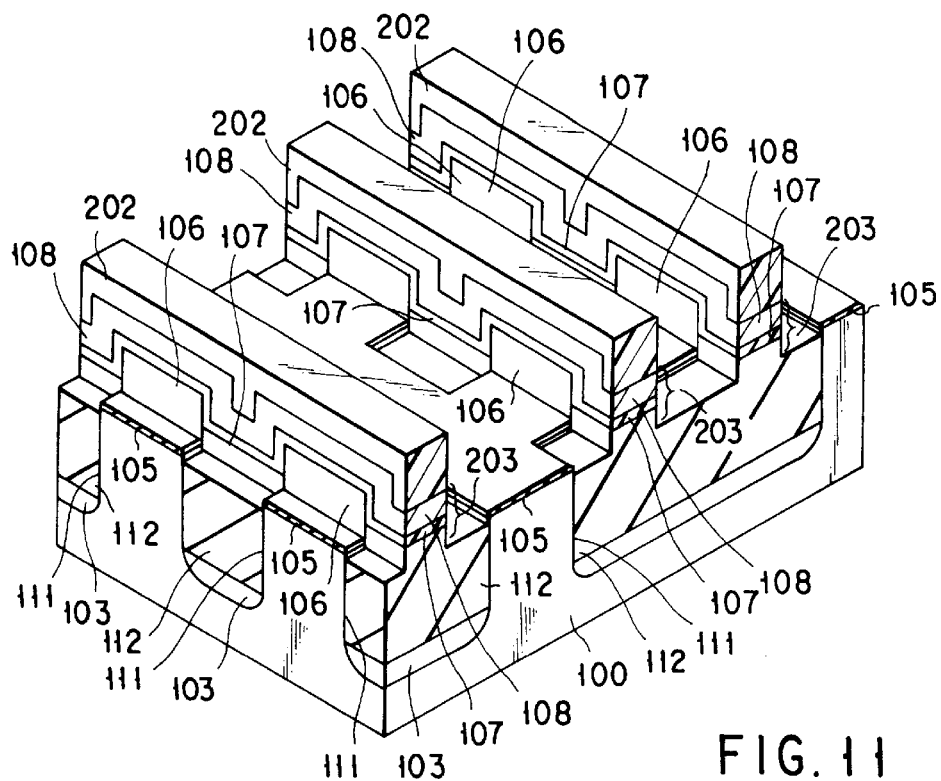
Figure 12:
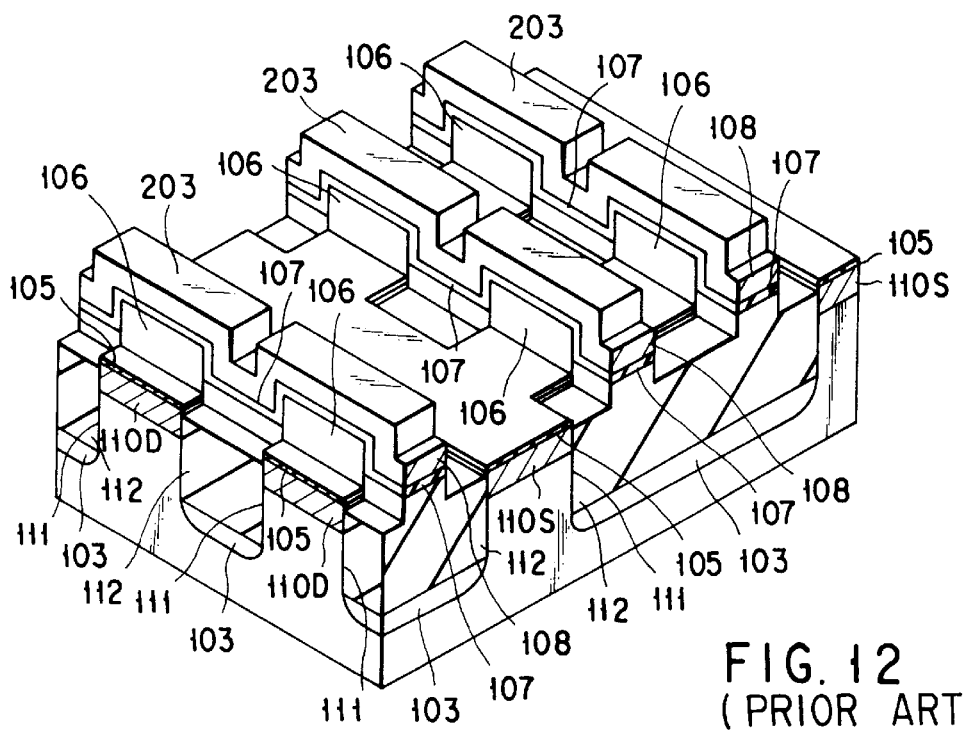
Figure 13:
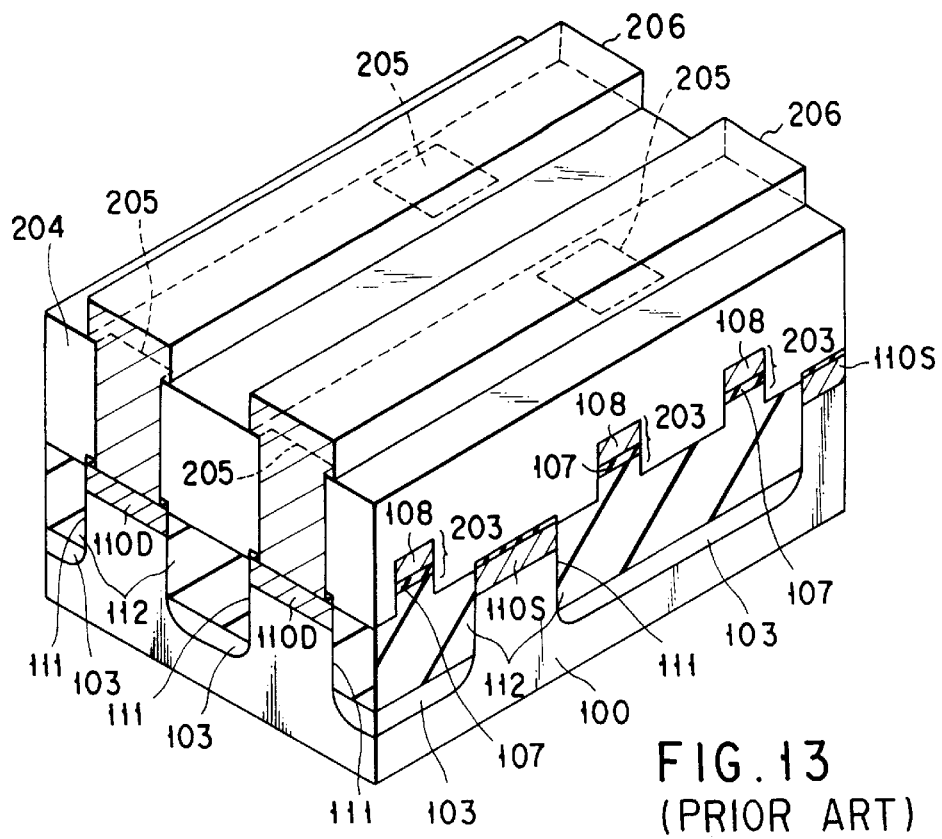
Figure 14:
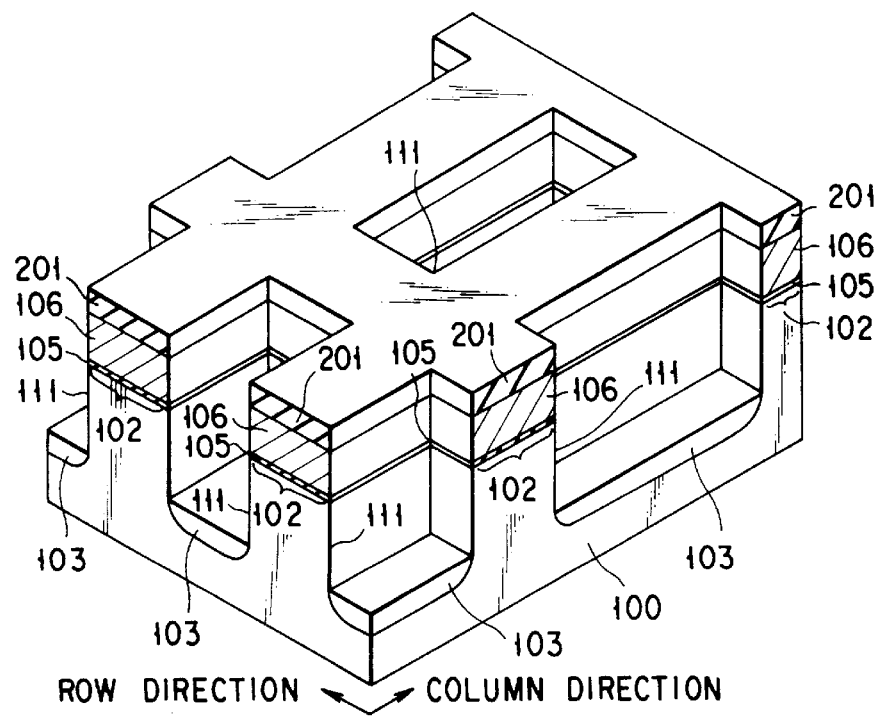
FIGS. 14 to 23 are, respectively, perspective views which show in due order the steps of manufacturing the EEPROM according to a first embodiment of the present invention.

First, as shown in FIG. 14, on the surface of a p-type silicon substrate (or a p-type well) 100, a tunnel oxide film ($SiO_2$) 105 is formed as a first gate oxide film. The thickness of the tunnel oxide film 105 is set within such a range that, by the voltage applied between the control gate and the silicon substrate, charge exchange can be performed between the floating gate and the silicon substrate. Said thickness is, for instance, 10 nm or less.

Next, on the tunnel oxide film 105, silicon is deposited to constitute an electrically conductive polycrystalline silicon film 106 which will be used as a floating gate later. The electrically conductive polycrystalline silicon film 106 is composed in such a manner that, by doping for instance an n-type impurity thereinto, the electrical conductivity is enhanced. Then, on the polycrystalline silicon film 106, a silicon nitride ($Si_3N_4$) is deposited, whereby a silicon nitride film 201 which will later be used as a mask is formed.

Subsequently, those portions of the silicon nitride film 201 which lie on the regions which will be used as trench type element isolation regions later are etched. Next, by the use of the silicon nitride film 201 as a mask, the polycrystalline silicon film 106 and the gate insulation film 105 are anisotropically etched. Subsequently, the substrate 100 is anisotropically etched, whereby trenches 111 are formed.

Next, the side walls of the trenches are washed, and thereafter, on the side walls, a thin insulation film such as, e.g. thin thermal oxide film ($SiO_2$) is formed. By the formation of this thin thermal oxide film, the etching damage caused on, e.g. the side walls of the trenches are repaired. As the method of repairing the damage, there are pointed out the thermal annealing method as well as the thermal oxidation method. Further, the thin thermal oxide film formed may be removed or may be left as it is. In case said thin thermal oxide film is left, said film serves as a protective film for protecting the side walls.

Further, in order to enhance the threshold voltage and the punch-through voltage of the parasitic MOSFET formed in the portion of the substrate which lies under each of the trenches 111 and the punch-through voltage, boron is injected into the substrate 100 from the bottom surfaces of the trenches 111, whereby p+ type channel stoppers 103 are formed. The channel stoppers 103 may be formed as required. Further, the depth of the trenches 111 can be suitably selected by taking into consideration the threshold voltage and the punch-through voltage of the parasitic MOSFET formed under the portion of the substrate 100 which lies under each of the trenches 111.

Figure 15:
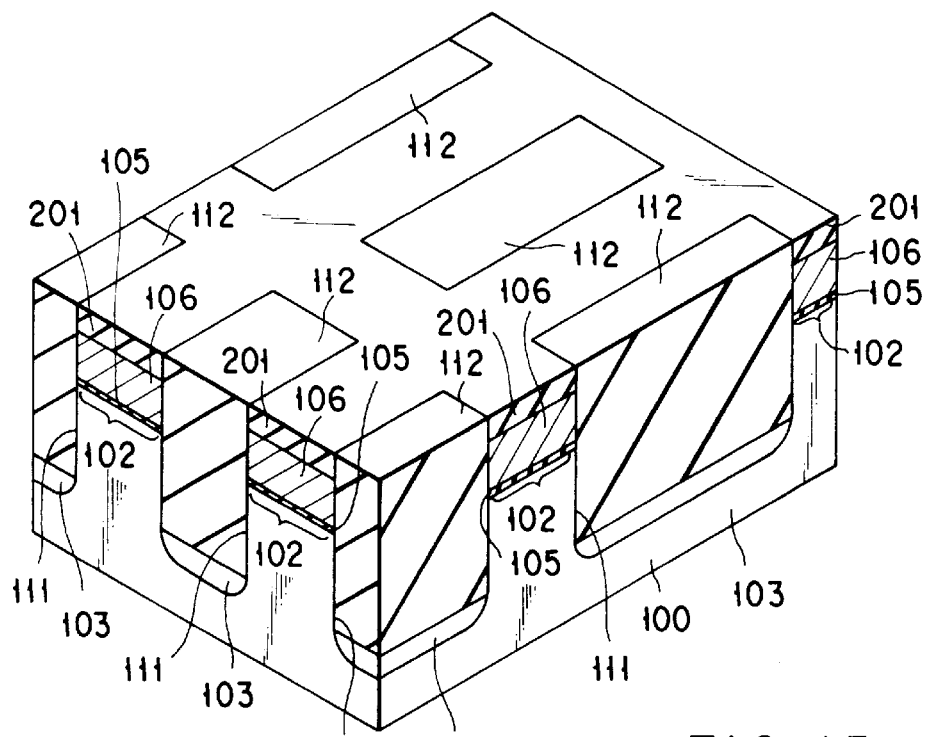

Next, as shown in FIG. 15, an insulating material such as, e.g. TEOS or BPSG is deposited over the whole surface, whereby the openings and the trenches 111 formed in the laminated structure consisting of the tunnel oxide film 105, the polycrystalline silicon film 106 and the nitride film 201 are filled up with the buried members 112. Subsequently, the surfaces of the thus deposited buried members 112 are flattened. For this flattening operation, a method such as, e.g. the etch-back method employing anisotropic etching or the chemical-mechanical polishing (CMP) method is used.

Figure 16:
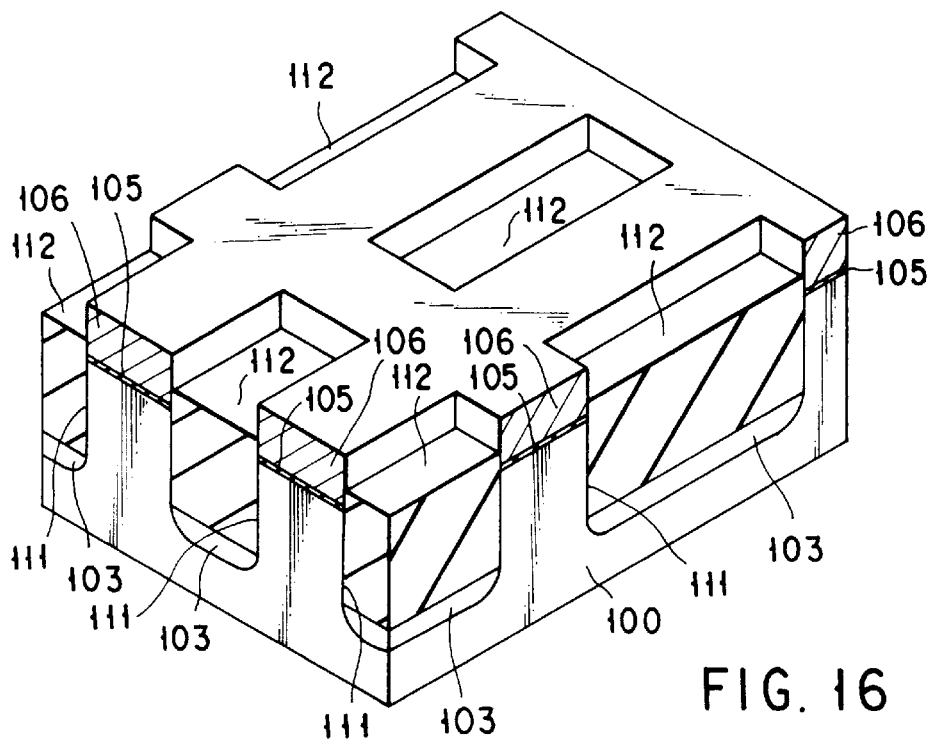

Next, as shown in FIG. 16, after the silicon nitride film 201 is removed, a photo resist layer (not shown) which has windows on a memory cell region is formed by the use of lithographic method. Subsequently, by the use of the photo resist layer (not shown) as a mask, the buried members 112 are dry-etched or wet-etched, so that the side wall portions of the polycrystalline silicon film 106 which extend above the upper surfaces of the buried members 112 are exposed. The thus exposed side wall portions of the polycrystalline silicon film 106 are used for the formation of a capacitance between them and the control gate. Due to this, the height of the exposed side wall portions is determined on the basis of the area necessary to constitute a desired capacitance C2 between the floating gate and the control gate. Then, the exposed side wall portions of the polycrystalline film 106 are washed.

Figure 17:
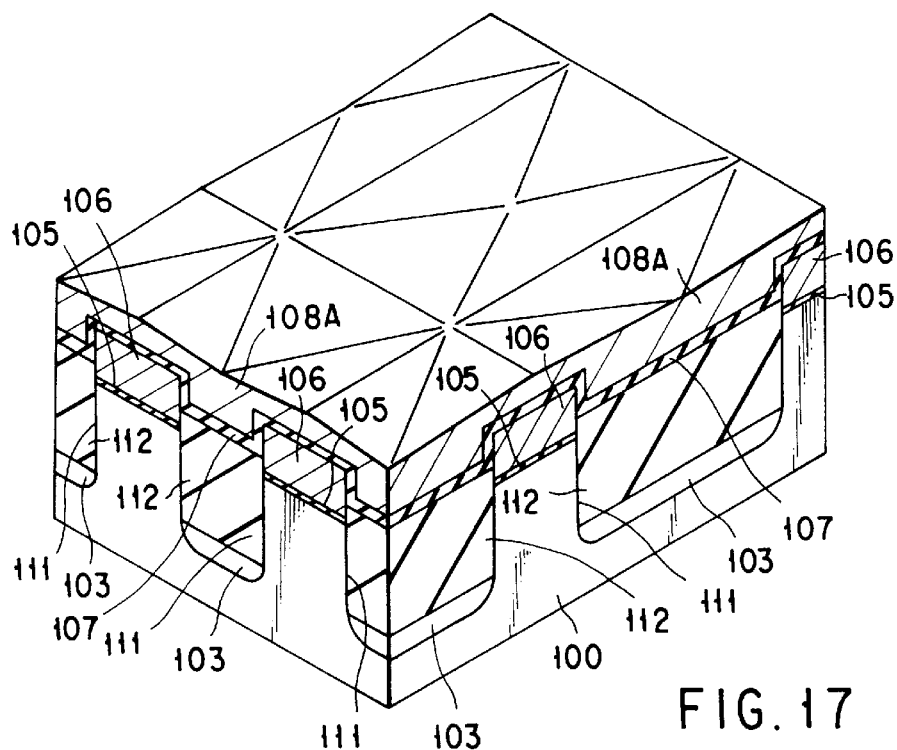

Next, as shown in FIG. 17, on the buried members 112 and the polycrystalline silicon film 100, a silicon oxide film ($SiO_2$), a silicon nitride film ($Si_3N_4$) and a silicon oxide film ($SiO_2$) are successively laminated, whereby a laminated ONO film 107 which will later be used as an inter-layer insulation film (second gate insulation film) which insulates the floating gate and the control gate from each other is formed. Subsequently, on the ONO film 107, a polycrystalline silicon is deposited, whereby an electrically conductive polycrystalline film 108 which will be used as the control gate later is formed. In this case, a polycrystalline film 108A is formed so as to fill up the "difference in level" portions produced as a result of the recession of the surfaces of the buried members 112 from the surface of the polycrystalline film 106. The electrically conductive polycrystalline silicon film 108A may be comprised of either an amorphous silicon film or a monocrystalline silicon film. Further, the electrically conductive polycrystalline silicon film 108A has an n-type impurity doped therein. Then, the surface of the polycrystalline silicon film 108A is flattened by the use of the etch-back method or the chemical-mechanical polishing method.

Figure 18:
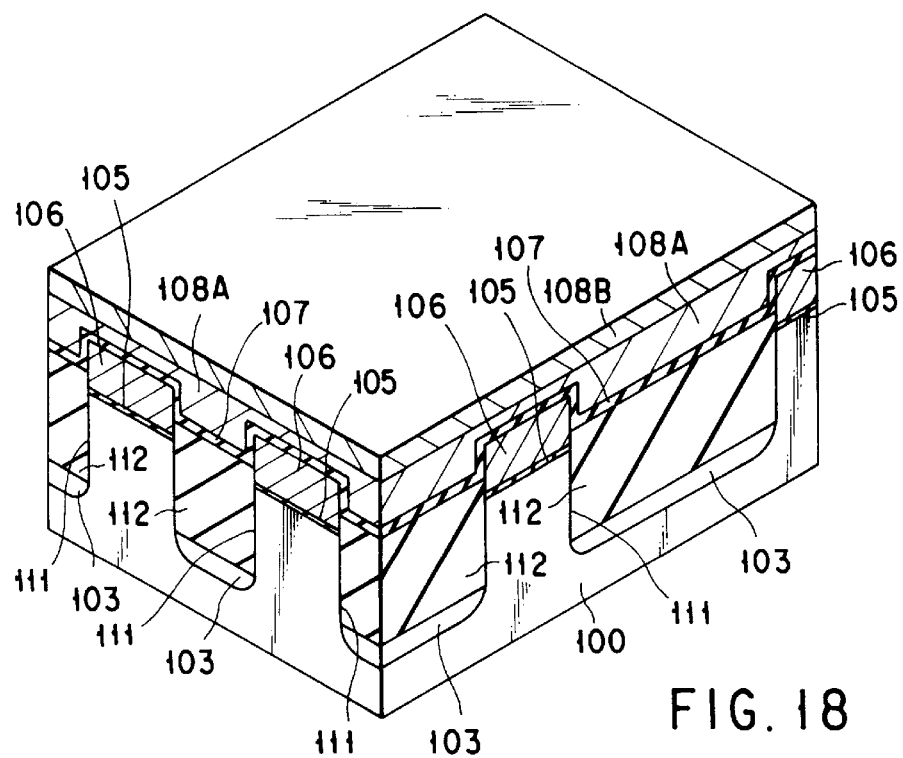

Next, as shown in FIG. 18, on the thus flattened polycrystalline silicon film 108A, a metal film 108B with a resistance lower than that of the polycrystalline silicon is formed, whereby a polymetal structure which is a laminated structure consisting of polycrystalline silicon and a metal is formed. The metal film 108B is composed of, for instance, tungsten (W).

Figure 19:
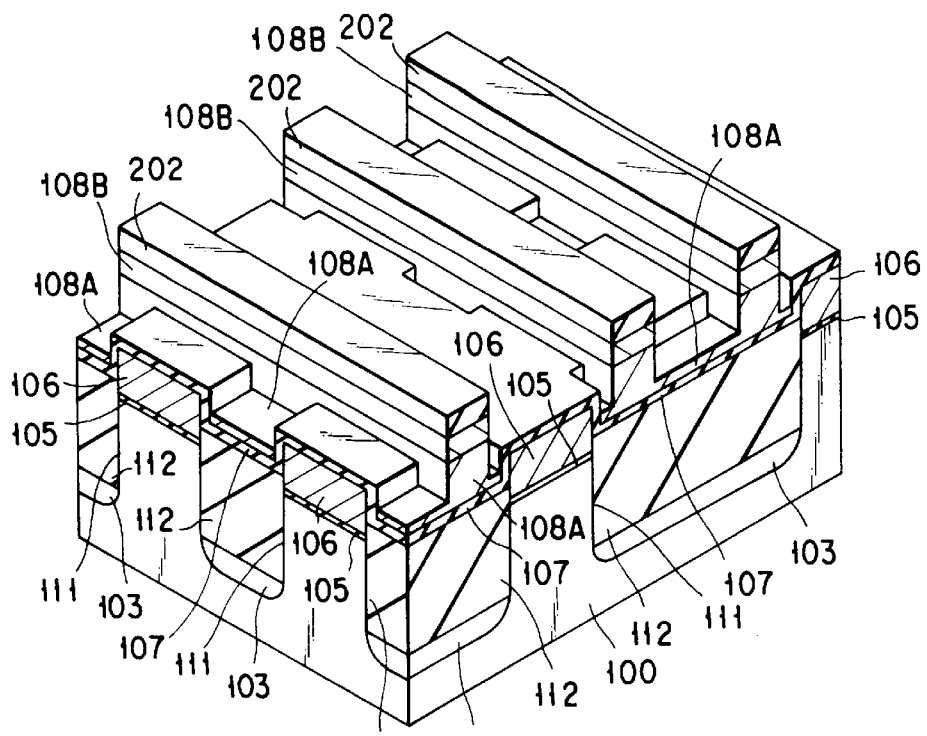

Next, as shown in FIG. 19, a photo resist is applied onto the metal film 108B to form a photo resist layer 202. Subsequently, this photo resist layer 202 is patterned into a control gate pattern by the use of the lithographic method. Then, by the use of the photo resist layer 202 as a mask, the metal film 108B and the polycrystalline silicon film 108A are anisotropically etched. In this case, the metal film 108B and the polycrystalline silicon film 108A are completely removed from above the polycrystalline silicon film 106, but, on the buried members 112, portions of the polycrystalline silicon film 108A are left.

Located above or on the buried members 112 are the opening portions formed in the polycrystalline silicon film 106. These opening portions also function as "slits" which will each separate the floating gate in the direction along the control gate. In other words, in each "slit" which will later separate the floating gate in the direction along the control gate, a portion of the polycrystalline film 108A which will later constitute the control gate is left.

In this embodiment, the manufacturing method employing the self-aligning trench element isolation technique is referred to, but, in case the present invention is applied to the manufacture of an EEPROM having a different type of trench type element isolation regions or an EEPROM having an LOCOS type element isolation regions, likewise, a portion of the polycrystalline silicon film 108A which will later become the control gate or constitute the control gate is left in the respective "slit" which will later separate the floating gate in the direction along the control gate.

Figure 20:
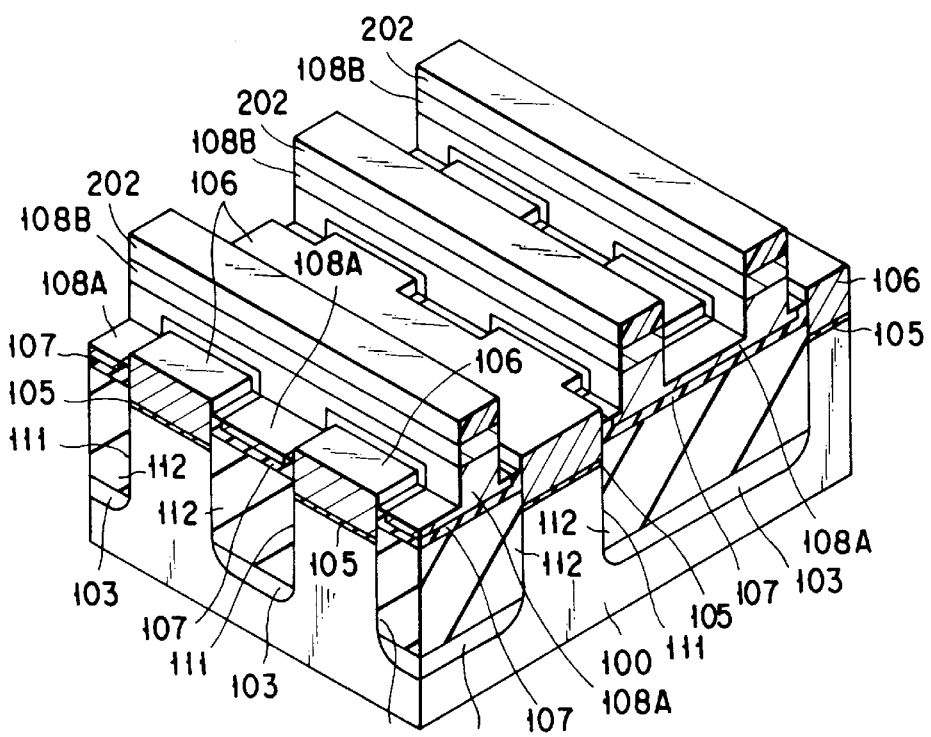

Next, as shown in FIG. 20, the ONO film 107 is anisotripically etched, so that the upper surface and portions of the sides surface of the polycrystalline film 106 are exposed. In this case, the left portions of the polycrystalline film 108A serve as a mask, so that the surfaces of the buried members 112 are not etched. Due to this, the surfaces of the buried members 112" are free from partial recession, and thus, the occurrence of "film decrease or loss" thereof is suppressed. As a result of the occurrence of the "film decrease or loss" being thus suppressed, the thickness of the buried members 112 can be maintained at the thickness value prescribed at the step shown in FIG. 16; and thus, the design structure is reproduced more faithfully to the actual structure.

Figure 21:
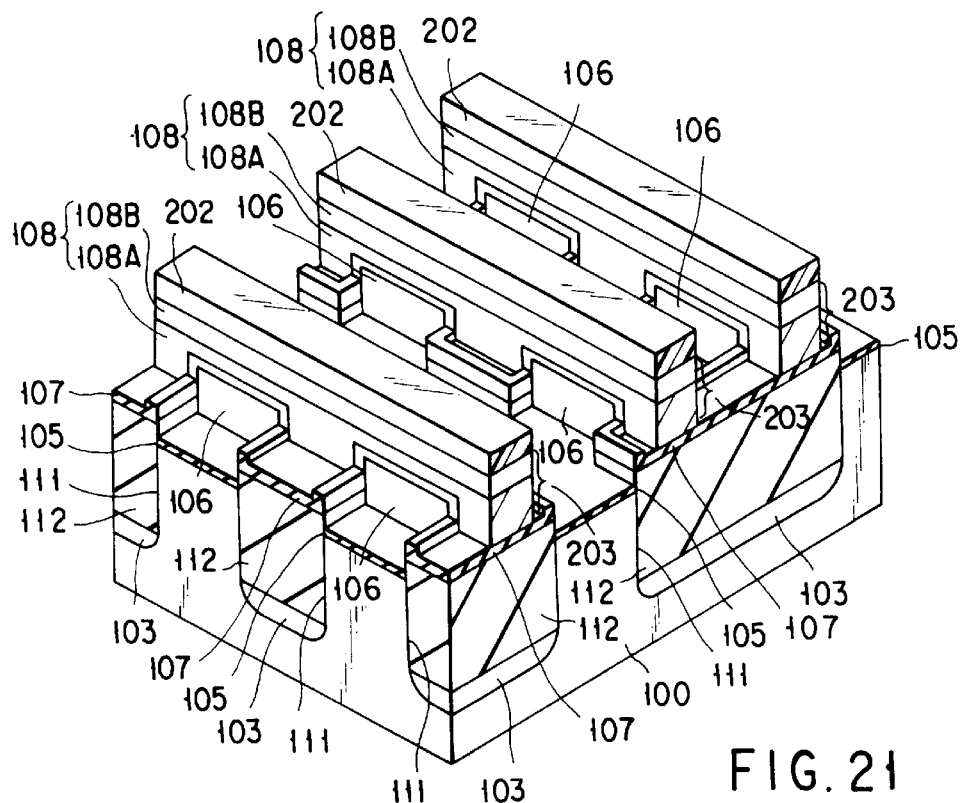

Next, as shown in FIG. 21, the polycrystalline silicon film 106 and the left portions of the polycrystalline silicon film 108A are anisotropically etched, whereby the polycrystalline silicon film 106 is cell-wise divided and separated, thus assuming the shape of floating gates. At the same time, the ONO film 107 is brought into the shape of inter-layer insulation films 107 which each insulate the floating gate 106 and the control gate 108 from each other. Further, the polycrystalline silicon film 108A and the metal film 108B are separated for the respective rows of the memory cell array, thus assuming the shape of control gates 108. As a result, laminated gate structures 203 each formed of the control gate 108, the inter-layer insulation film 107 and the floating gate 106 are completed. In the present specification, the buried members 112 after the completion of the laminated gate structures 203 will be referred to as trench type element isolation regions 112 or merely as element isolation regions 112.

Figure 22:
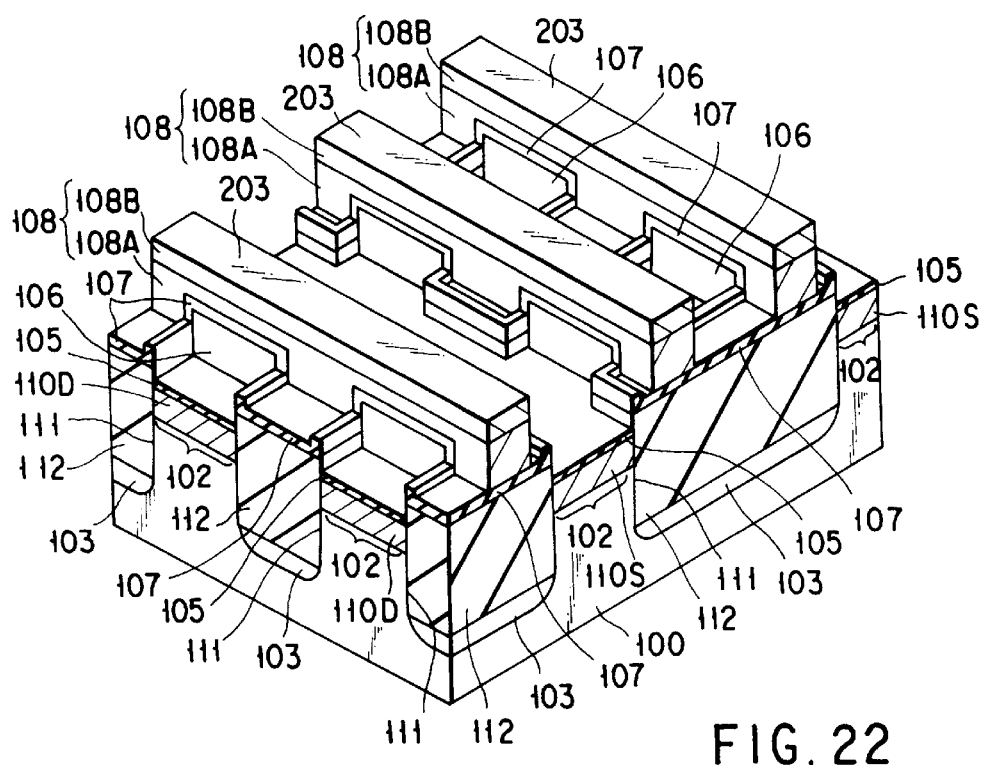

Next, as shown in FIG. 22, after or before the photo resist layer 202 is removed, a donor impurity such as phosphorus is injected into the substrate 100 by ion implantation by the use of the laminated structures 203 and the element isolation regions 112 as a mask, whereby n+ type source regions 110S and n+ type drain regions 110D are formed.

Figure 23:
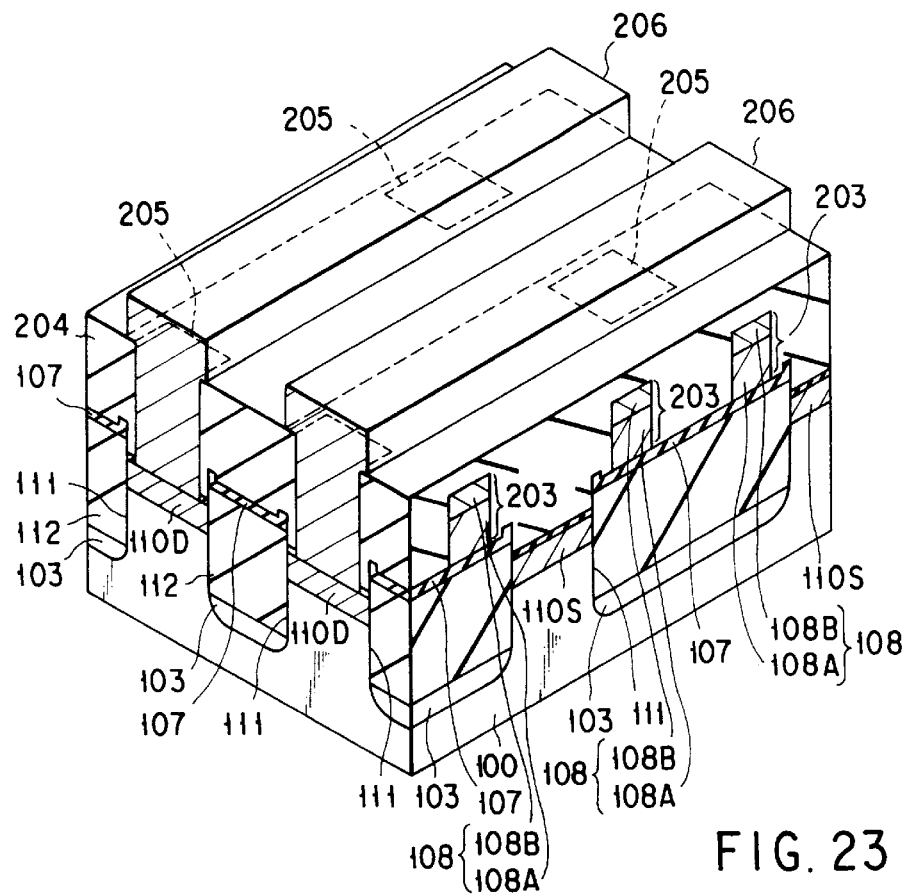

Next, as shown in FIG. 23, an inter-layer insulation film 204 is formed so as to fill up the portions between the laminated gate structures 203 and insulate the laminated gate structures from each other, and, in the inter-layer insulation film 204, contact holes 205 leading to the drain regions 110D are formed, and, on the inter-layer insulation films 204, there are formed bit lines 206 electrically connected to the drain regions 110D through the contact holes 205, with which the memory cells of the EEPROM are completed.

In the case of the above-described method for the manufacture of EEPROM according to the first embodiment of the present invention, as shown particularly in FIG. 20, portions of the ONO film 107 and the polycrystalline silicon film 108A are left on the surfaces of the buried members 112. As a result, it is ensured that, when the laminated gate structures 203 are processed for formation thereof, the surfaces of the buried members 112 are hard to recede, and thus, the occurrence of "film decrease or loss" is suppressed. Since the occurrence of "film decrease or loss" is thus suppressed, an "insufficient burying-in" is hard to occur when the inter-layer insulation film 204 is buried in. Further, the side faces of the element regions (active regions) 102 can be surely protected by the buried members 112, so that, for instance when the polycrystalline silicon film 106 is etched, it never happens the substrate 100 is etched.

Thus, according to the first embodiment of the present invention, EEPROMs each having fine trench type element isolation regions can be manufactured at a good yield. Further, in respect of the structure thereof, the protection of the side faces of the element regions 102 by the buried members 112 can be further ensured as compared with the conventional technique, so that the reliability of the EEPROMs is also enhanced.

(Second Embodiment)

Figure 24:
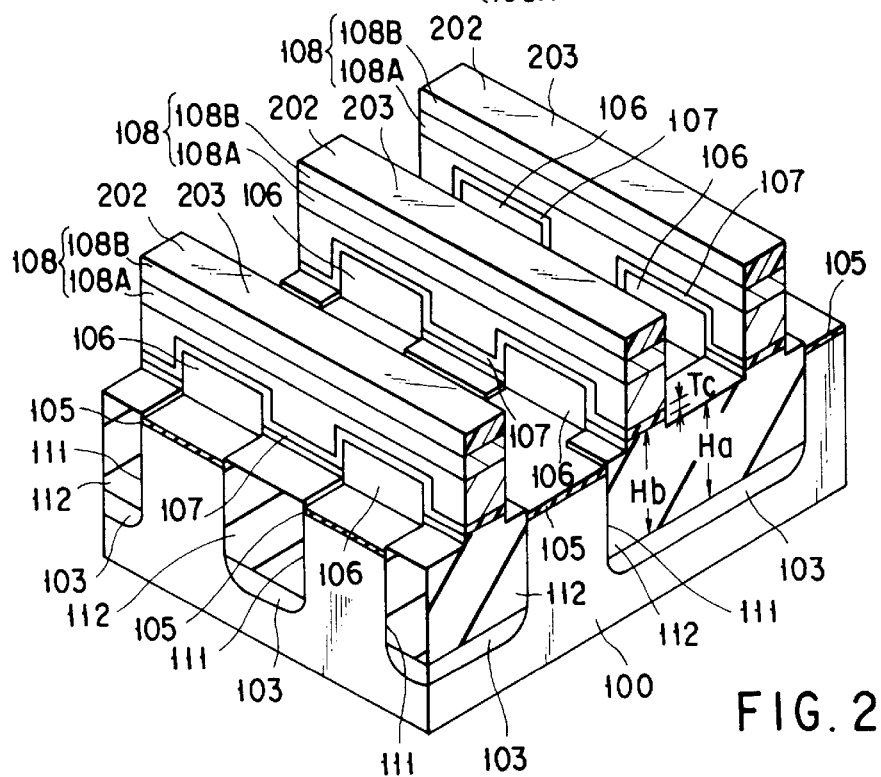
FIG. 24 is a perspective view which shows the EEPROM according to a second invention of the present invention

FIG. 24 is a perspective view, at one manufacturing step, of the FETMOS type EEPROM formed by the use of the self-aligning trench element isolation technique according to a second embodiment of the present invention. In FIG. 24, the pattern of an NOR type EEPROM is shown by way of example as in the case of the first embodiment.

In the case of the first embodiment, the ONO film is left on the surface of the respective buried member 112, but, according to the manufacturing method of the first embodiment, the ONO film 107 may be finally removed from the surface of the buried member 112, depending on, e.g. the variation or fluctuation of the manufacturing conditions, as shown in FIG. 24.

According to the manufacturing method of the first embodiment, the ONO film 107 on the respective buried member 112 is never excessively etched. Thus, the difference between the film thickness "Ha" of the portion of each buried member 112 which lies between the adjacent control gates and the film thickness "Hb" of the portion of the buried member 112 which lies under each control gate can be held down to less than the film thickness "Tc" of the ONO film 107. In other words, the "film decrease or loss" taking place of the surface of the buried member 112 can be held down to less than the film thickness "Tc" of the ONO film 107. So long as the "film decrease or loss" is of such a value, it is within a practically permissible range.

The relationship mentioned above can be expressed as follows:

$$Hb - Ha < Tc \tag{1}$$

In this connection, it is pointed out that, in the case of the EEPROM according to the first embodiment, "Hb"="Ha", which falls under the relationship defined by the equation (1).

(Third Embodiment)

A third embodiment of the present invention will now be described.

In the first and second embodiments of the present invention, the present invention is applied to NOR type EEPROMs, but, in the third embodiment, the present invention is applied to an NAND type EEPROM.

FIGS. 25 to 36 are, respectively, perspective views which show the steps of the method for manufacturing the memory cells of an FETMOS type EEPROM by the use of the self-aligning trench element isolation technique according to the third embodiment of the present invention.

Figure 25:
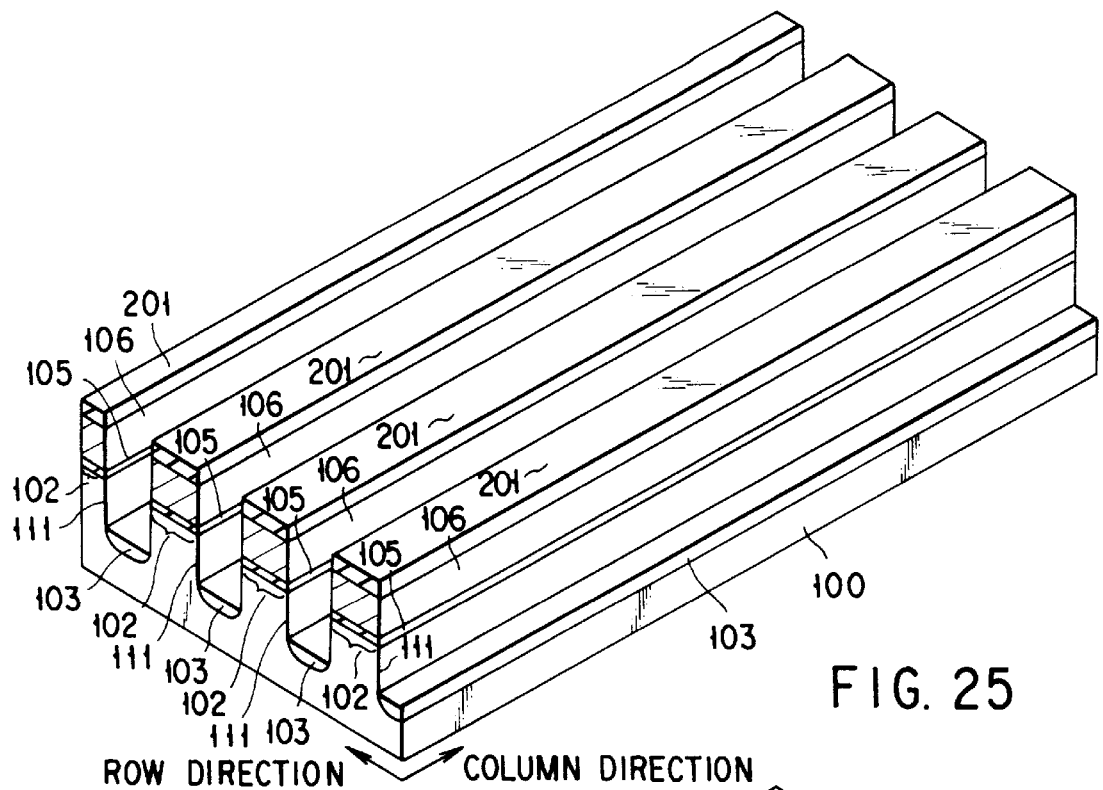
FIGS. 25 to 36 are, respectively, perspective views which show in due order the steps of manufacturing the EEPROM according to a third embodiment of the present invention.

First, as shown in FIG. 25, a tunnel oxide film (SiO$_2$) 105 as a first gate oxide film is formed on the surface of a p-type silicon substrate (or, a p-type well) 100. The thickness of the tunnel oxide film 105 is, for instance, 10 nm or less as in the case of the first embodiment. Then, on the tunnel oxide film 105, silicon is deposited to form an electrically conductive polycrystalline silicon film 106 which will later become a floating gate. The electrically conductive polycrystalline silicon film 106 has for instance an n-type impurity doped therein to enhance the electrical conductivity.

Next, on the polycrystalline silicon film 106, a silicon nitride ($Si_3N_4$) is deposited to form a silicon nitride film 201 which will be later used as a mask. Then, those portions of the silicon nitride 201 which lie on the regions which will be later used as trench type element isolation regions are etched. Then, by the use of the silicon nitride film 201 as a mask, the polycrystalline silicon film 106 and the gate insulation film 105 are anisotrically etched. Subsequently, the substrate 100 is anisotropically etched, whereby trenches 111 are formed.

Next, the side walls of the trenches 111 are washed, and thereafter, a thin insulation film (not shown) such as, e.g. a thin thermal oxide film ($SiO_2$) is formed on the side walls of said trenches 111. Then, boron is injected into the substrate 100 through the bottoms of the trenches 111 to form p+ type channel stoppers 103. The channel stoppers 103 may be formed as required.

Figure 26:
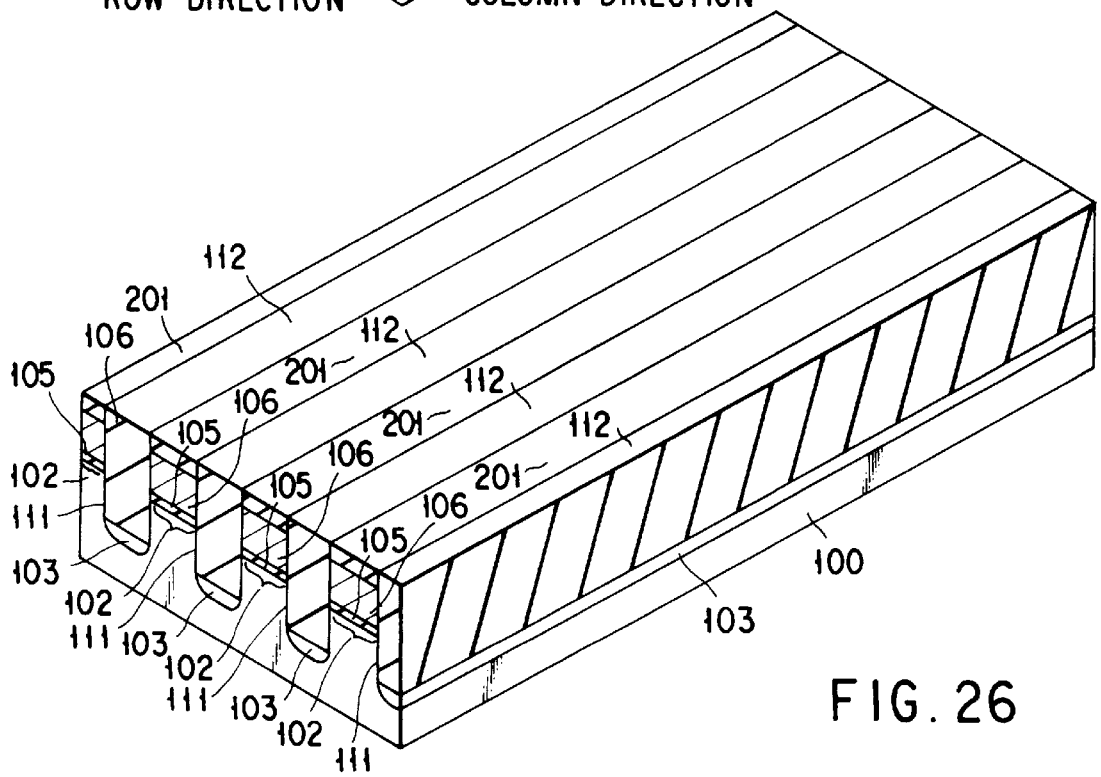

Next, as shown in FIG. 26, an insulating material such as TEOS or BPSG is deposited over the whole surface, whereby the openings and the trenches 111 formed in the laminated structure consisting of the tunnel oxide film 105, the polycrystalline silicon film 106 and the nitride film 201 are filled up with a filling or burying material 112. Then, the surface of the thus deposited burying material 112 is flattened. This flattening operation is carried out by the use of, e.g. the etch-back method using anisotropical etching or the chemical-mechanical polishing (CMP).

Figure 27:
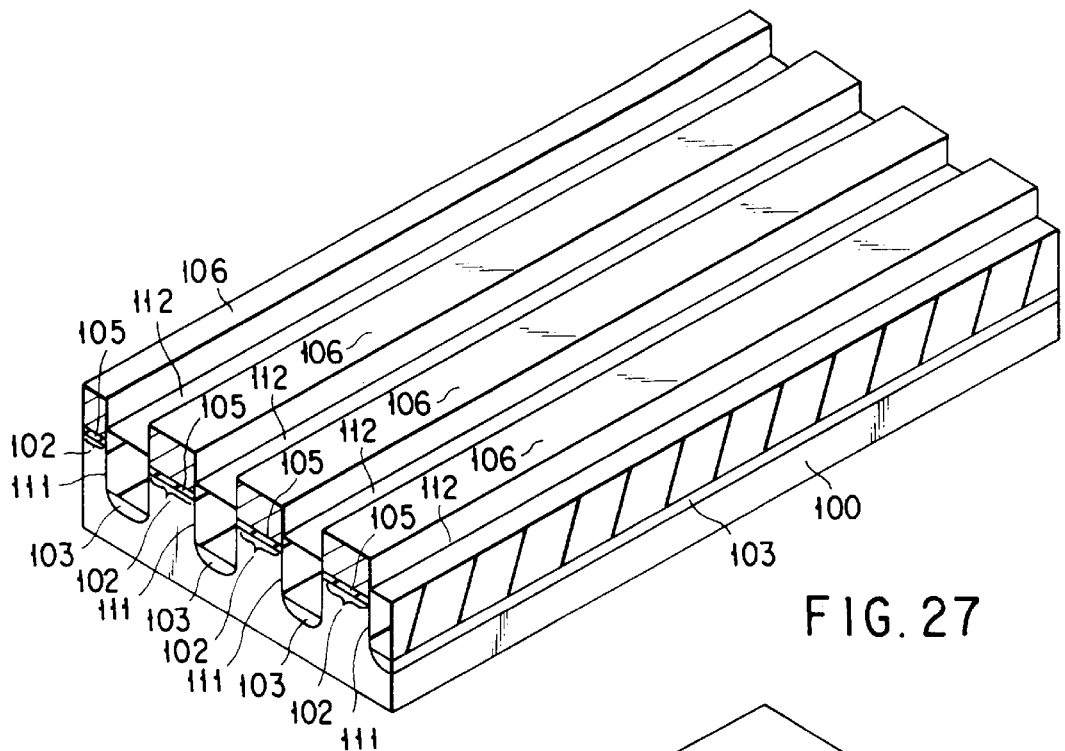

Next, as shown in FIG. 27, after the silicon nitride film 201 is removed, a photo resist layer (not shown) having windows on a memory array region is formed by the use of the lithographic method. Then, by the use of the photo resist layer (not shown) as a mask, the buried members 112 are dry-etched or wet-etched, so that the side wall portions of the polycrystalline silicon film 106 which extend upward from the upper surfaces of the buried members 112 are exposed. The thus exposed side walls of the polycrystalline silicon film 106 are used for producing a capacitance between said side wall portions and the control gate. Due to this, the height of the exposed side wall portions is determined depending on the area necessary for obtaining a desired capacitance C2 between the floating gate and the control gate. Then, the exposed side wall portions of the polycrystalline silicon film 106 are washed.

Figure 28:
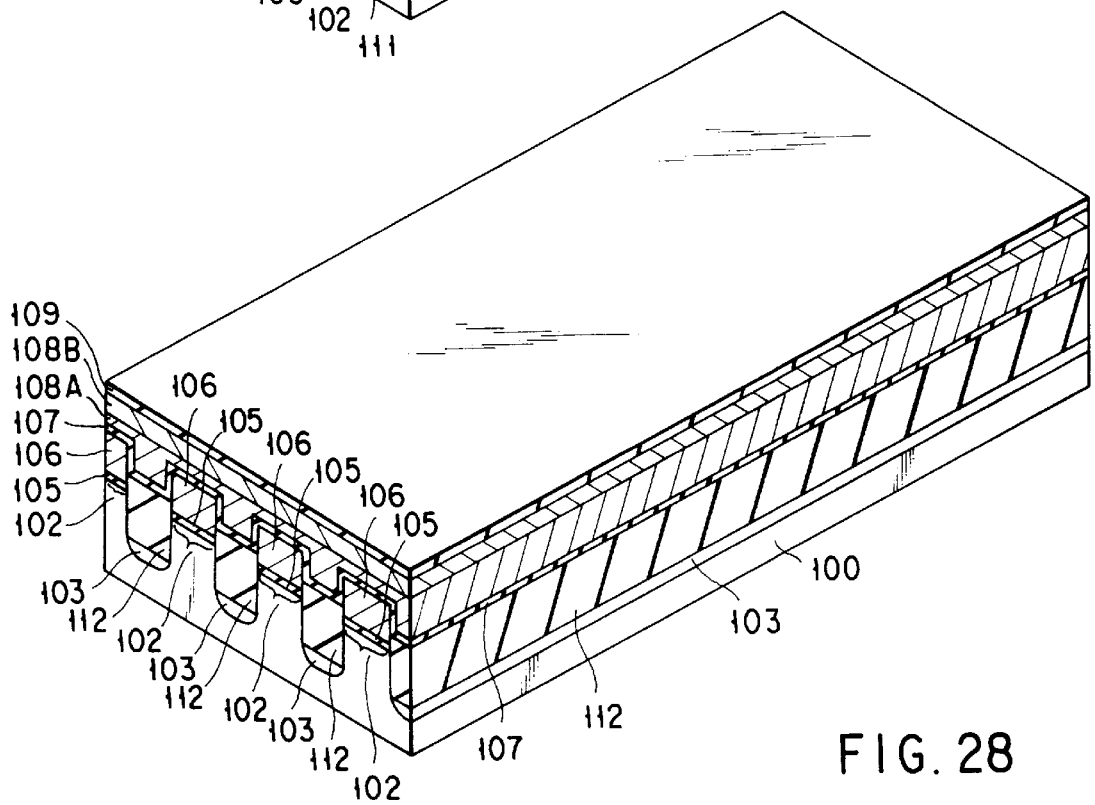

Next, as shown in FIG. 28, on the buried members 112 and the polycrystalline silicon film 106, a silicon oxide film ($SiO_2$), a silicon nitride film ($Si_3N_4$) and a silicon oxide film ($SiO_2$) are successively laminated to form a laminated ONO film 107 which will later constitute an inter-layer insulation film (a second gate insulation film).

Next, on the ONO film 107, polycrystalline silicon is deposited to form an electrically conductive polycrystalline silicon film 108A which will later become a control gate. In this case, the polycrystalline silicon film 108A is formed so as to fill up the differences in level caused as a result of the recession of the surfaces of the buried members 112 from the surface of the polycrystalline silicon film 106. The electrically conductive polycrystalline silicon film 108A may either be an amorphous silicon film or a monocrystalline silicon film. Further, the electrically conductive polycrystalline silicon film 108A has an n-type impurity doped therein.

Next, the surface of the polycrystalline silicon film 108A is flattened by the use of the etch-back method or the chemical-mechanical polishing method. Subsequently, on the thus flattened polycrystalline silicon film 108A, there is formed a metal film 108B which has a resistance lower than that of the polycrystalline silicon; and thus, a polymetal structure which is a laminated structure consisting of polycrystalline silicon and metal. The metal film 108B is composed of, e.g. tungsten (W), Next, on the metal film 108B, a cap layer 109 is formed. The cap layer 109 serves as a mask when a self-aligning contact is effected by the use of the laminated gate structure, and, as the material of said cap layer 109, a material which has an etching rate different from that of the inter-layer insulation film in which the contact holes are formed. For instance, in case the inter-layer insulation film is made of a silicate glass series material, for instance a silicon nitride film ($Si_3N_4$) is used as the material of the cap layer 109.

Figure 29:
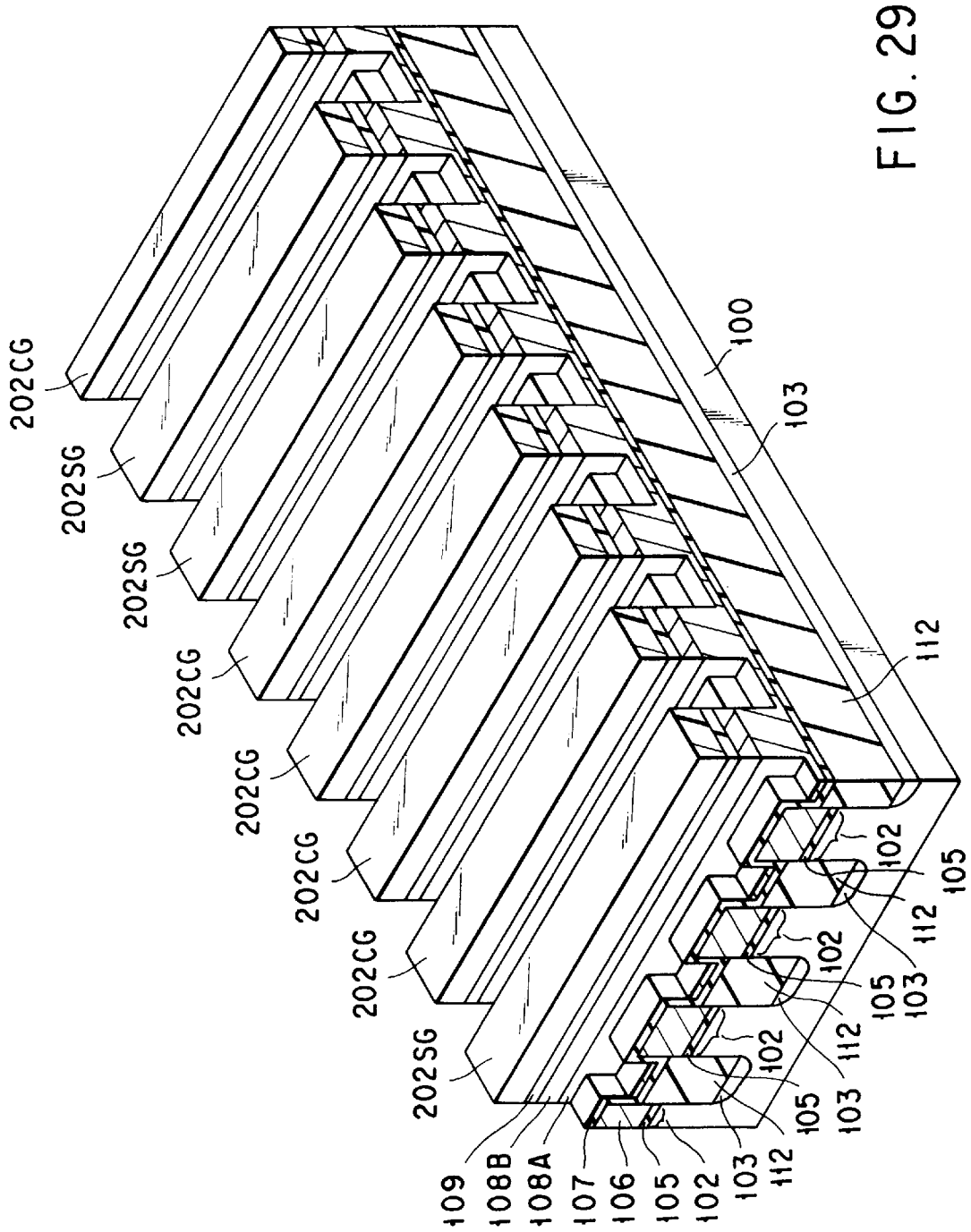

Next, as shown in FIG. 29, on the cap layer 109, a photo resist is applied to form a photo resist layer. Subsequently, the photo resist layer is patterned into a control gate pattern 202CG and a selection gate pattern 202SG.

Next, by the use of the patterns 202CG and 202SG, the cap layer 109, the metal film 108B and the polycrystalline silicon film 108A are anistropically etched. In this case, the cap layer 109, the metal layer 108B and the polycrystalline silicon film 108A are completely removed from above the polycrystalline silicon film 106, but, above the buried members 112, portions of the polycrystalline silicon film 108A are left. Located above the respective buried member 112 is the opening portion formed in the polycrystalline silicon film 106. This opening functions also as a "slit" which will later separate the floating gate in the direction along the control gate. That is, in the "slit" which will later separate the floating gate in the direction along the control gate, a portion of the polycrystalline silicon film 108A which will later constitute the control gate is left.

Further, in this embodiment, a manufacturing method using the self-aligning trench element isolation technique is referred to, but, also in case the present invention is applied to an EEPROM which has other trench type element isolation regions or an NAND type EEPROM which has LOCOS type element isolation regions, a portion of the polycrystalline silicon film 108A which will later become the control gate or constitute the control gate is likewise left in the "slit" which will separate the floating gate in the direction along the control gate.

Figure 30:
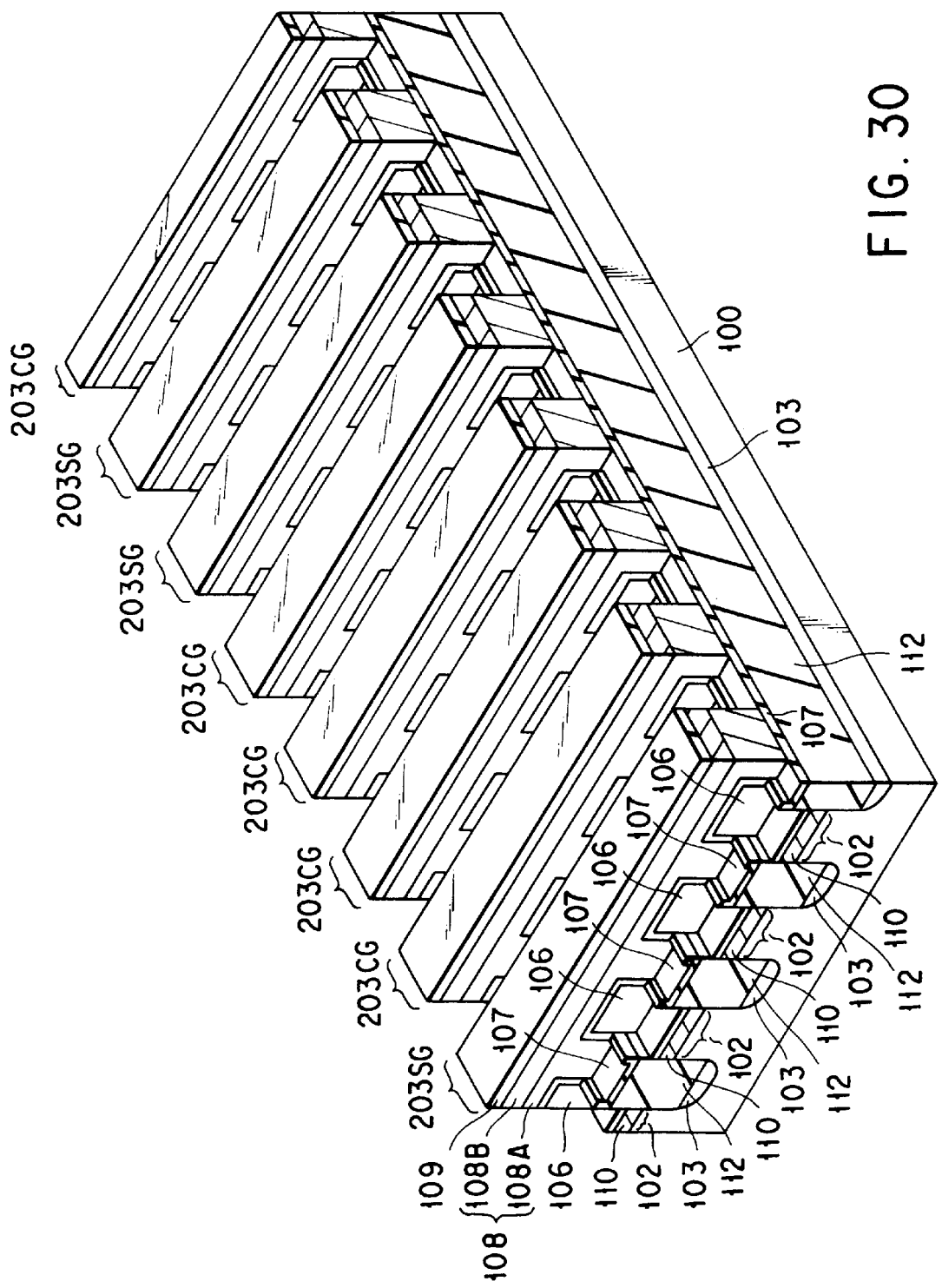

Next, as shown in FIG. 30, the ONO film 107 is anisotropically etched, whereby the upper surface and portions of the side faces of the polycrystalline silicone film 106 are exposed. In this case, the left portions of the polycrystalline silicon film 108A serves as a mask, so that the surfaces of the buried members 112 are never etched. Due to this, the surfaces of the buried members 112 are not subjected to partial recession, and thus, the occurrence of "film decrease or loss" is suppressed. Due to the fact that the occurrence of "film decrease or loss" is suppressed, the thickness of the buried members 112 can retain their thickness prescribed at the step shown in FIG. 27, and thus, the designed structure can be reproduced more faithfully to the actual structure.

Next, the polycrystalline film 106 and the left portions of the polycrystalline silicon film 108A are anisotropcially etched. As a result, the polycrystalline silicon film 106 is cell-wise divided for the respective memory cells, assuming the shape of floating gates 106. At the same time, the ONO film 107 assumes the shape of inter-layer insulation film 107 which insulates the floating gate 106 and the control gate 108 from each other. Further, the polycrystalline silicon film 108A and the metal film 108B are row-wise divided into portions for the respective rows of the memory cells, assuming the shape of control gate/selection gates 108. Thus, laminated gate structures 203CG for control gates and laminated gate structures 203SG for selection gates which each comprise the control gate/selection gate 108, the inter-layer insulation film 107, the floating gate 106 and have their upper surfaces covered by the cap layer 109, are completed. In the present specification, the buried members 112 will be referred to as trench type element isolation regions 112 or element isolation regions 112 after the completion of the laminated gate structures 203CG and 203SG.

Subsequently, after or before the removal of the patterns 202CG and 202SG, a donor such as phosphorus is injected into the substrate 100 by ion implantation by the use, as a mask, of the laminated gate structures 203CG and 203SG and the element isolation regions 112, whereby n+ type source and drain regions 110 are formed.

Figure 31:
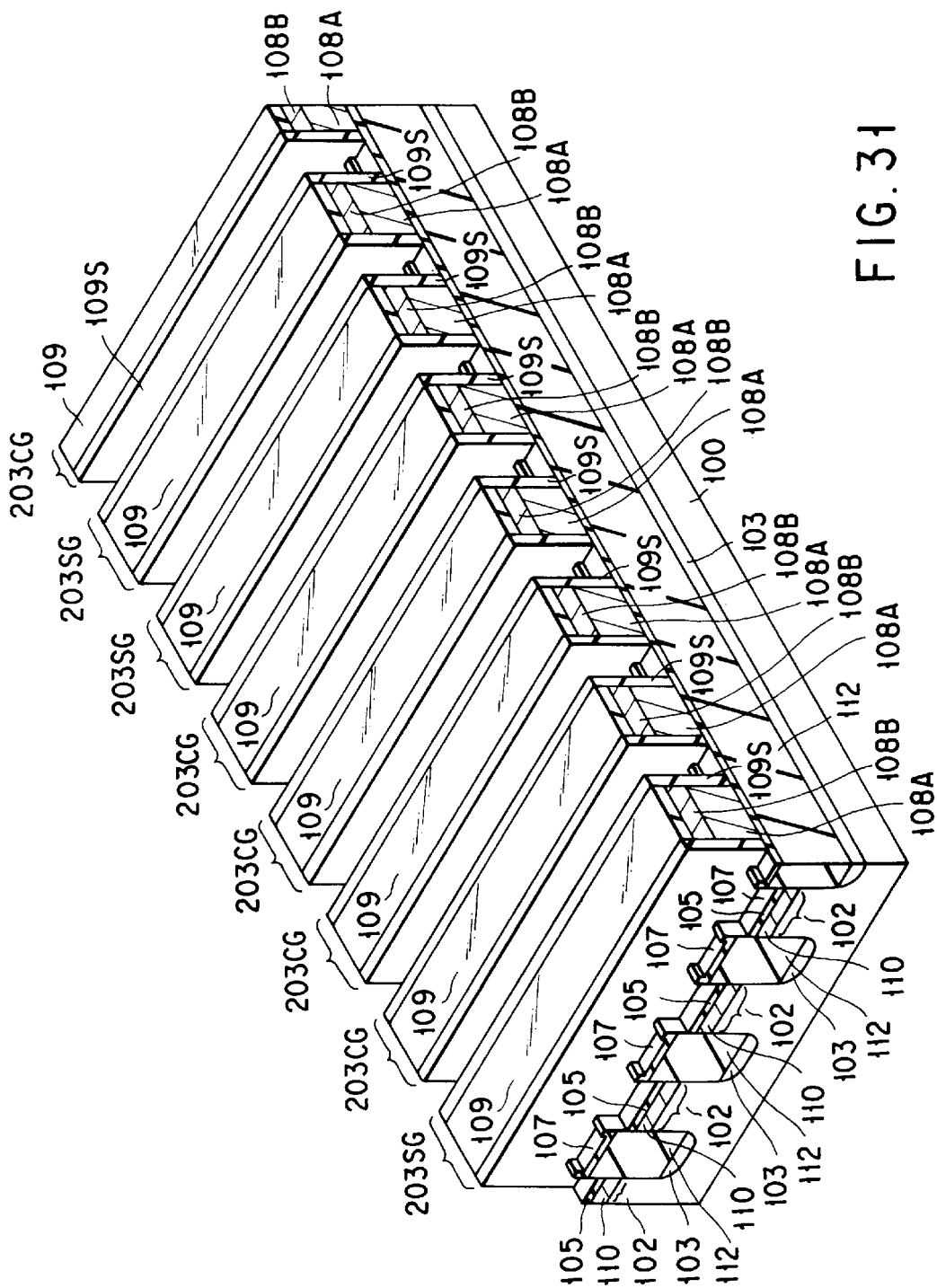

Next, as shown in FIG. 31, side wall spacer films 109S are formed on the side walls of the laminated gate structures 203CG and 203SG. The side wall spacer films 109S serve as a mask as the cap layers 109 does at the time of the self-aligning contact using the laminated gate structures 203SG, and, as the material of said side wall spacer films 109SG, a material which is different in etching rate from the inter-layer insulation film in which the contact holes are formed. For instance, in case the inter-layer insulation film is composed of a silicate glass series material, the side wall spacer films 109 are composed of, e.g. silicon nitride films ($Si_3N_4$).

Further, the n+ source and drain regions 110 may also be formed after the formation of the side wall spacer films 109S. Further, it is alternatively possible to employ the process that, after low-density n-type source and drain regions are formed by the use, as a mask, of the laminated gate structures 203CG and 203SG and the element isolation regions 112, high-density n-type source and drain regions are formed by the use of the side wall spacer films 109 as a mask, and the memory cell transistors and the selection transistors are rendered into the LDD (lightly doped drain) structure.

Figure 32:
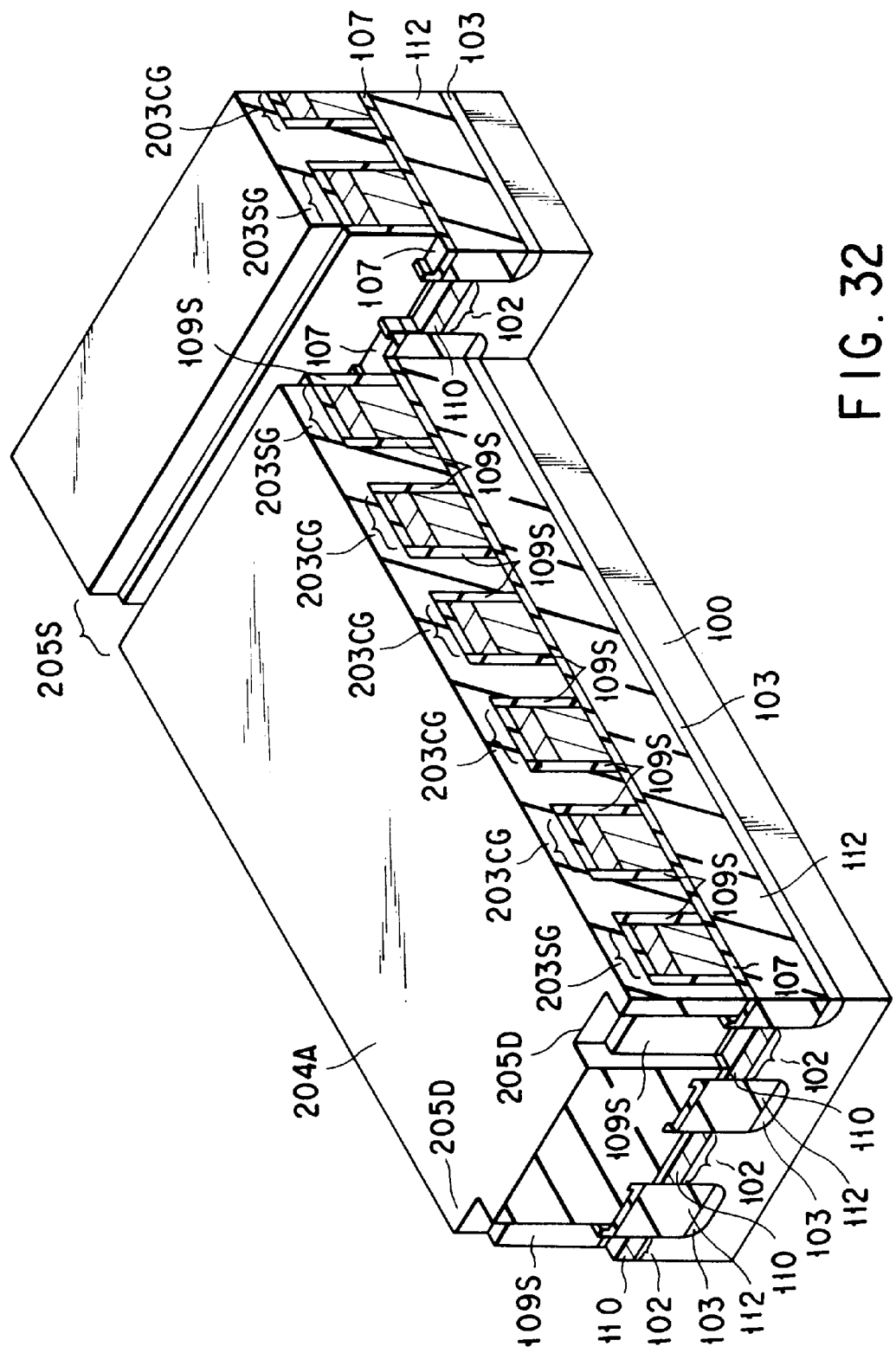

Next, as shown in FIG. 32, a first inter-layer insulation film 204A composed of, e.g. silicon dioxide is formed in such a manner as to fill up the spaces between the laminated gate structures 203CG and 203SG and electrically insulate them from each other.

Subsequently, contact holes 205D leading to the regions—of the source and drain regions 110—which function as drains and contact holes 205S leading to the regions which function as sources are formed in the inter-layer insulation film 204A, respectively. In this case, the contact holes 205S are formed in a stripe-like shape in which the regions which are isolated from each other by the element isolation regions 112 and function as sources are wired to each other along the portion between the laminated gate structures 203SG. Further, the contact holes 205D and 205S are formed by the use of the self-aligning contact technique utilizing the cap layer 109 and the side wall spacer films 109S as an etching mask. Further, in this embodiment, silicon nitride is contained in the interlayer insulation film 107 left on the element isolation regions 112. Due to this, the inter-layer insulation film 107 serves as a mask for protecting the element isolation regions 112 from etching.

Figure 33:
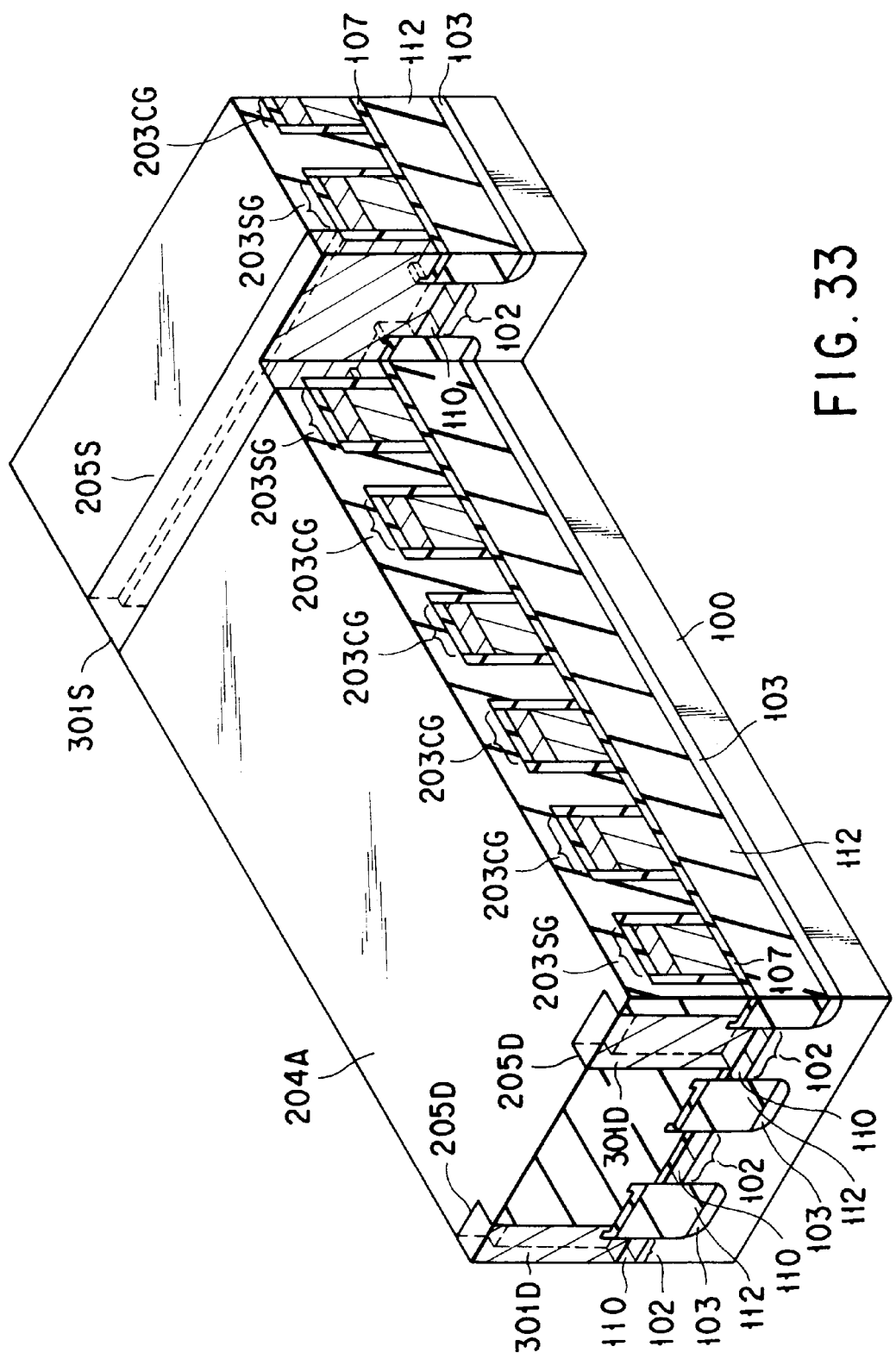

Next, as shown in FIG. 33, the interiors of the contact holes 205D and 205S are filled up with, e.g. electrically conductive polycrystalline silicon, respectively, whereby there are formed buried electrode layers 301D which lead, up to the surface of the inter-layer insulation film 204, the regions—of the source and drain regions 110—which function as drains, and there is also formed a buried electrode 301S which leads, up to the surface of the inter-layer insulation film 204A, the regions existing along the portion between the laminated gate structures 203SG and functioning as sources, wherein said regions are led up to said surface in a state wired to each other. The buried electrode layer 301S functions also as a source wire.

Figure 34:
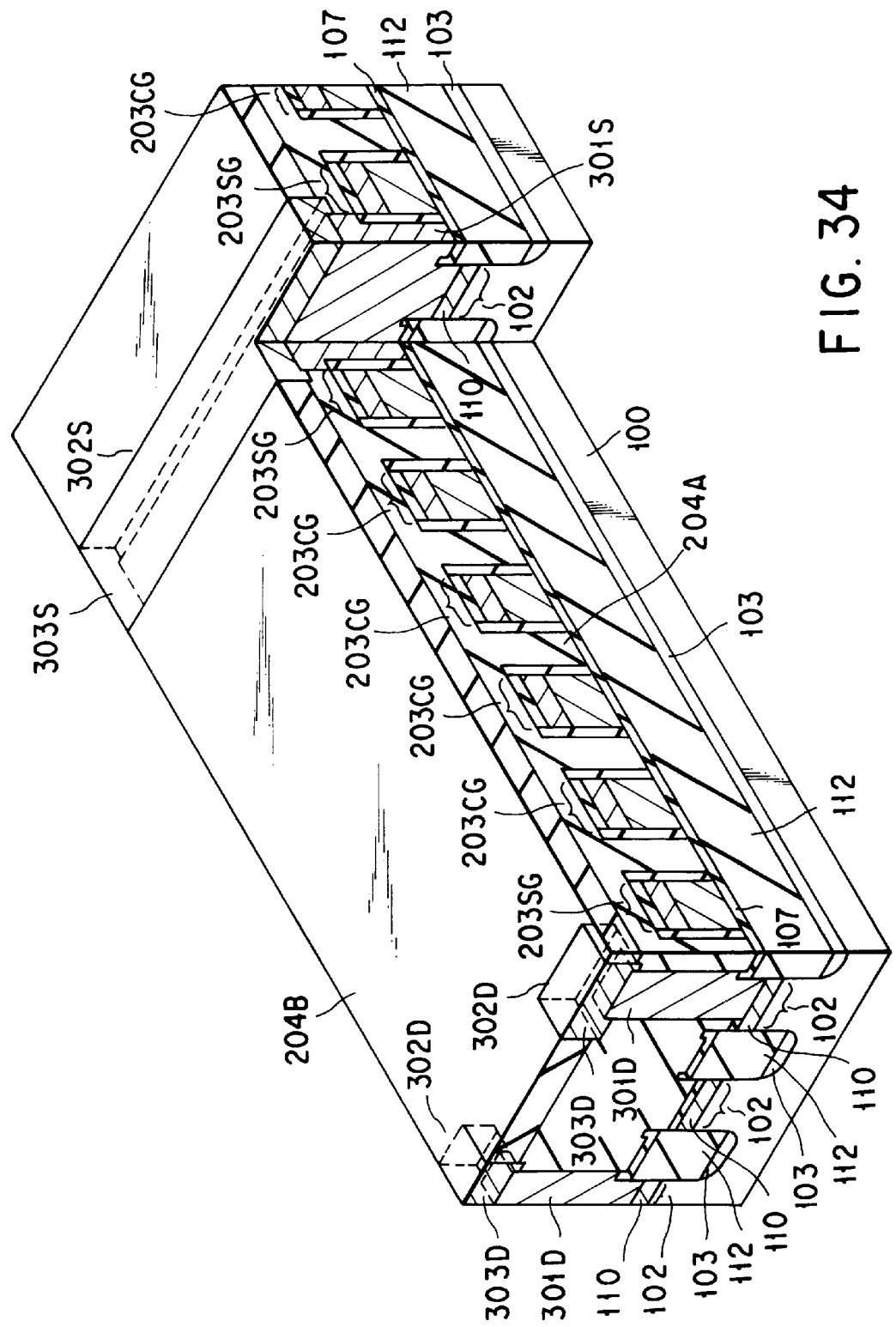

Next, as shown in FIG. 34, a second inter-layer insulation film 204B composed of, e.g. silicon dioxide is formed on the inter-layer insulation film 204A and the respective exposed surfaces of the buried electrode layers 301D and 301S. Subsequently, contact holes 302D leading to the buried electrode layers 301D and a contact hole 302S leading to the buried electrode layer 301S are formed in the inter-layer insulation film 204B, respectively. In this case, the contact hole 302S is formed in a stripe-like shape extending along the planar shape of the buried electrode layer 301S. Then, the interiors of the contact holes 302D and 302S are filled up with a low-resistance metal such as, e.g. tungsten. Thus, low-resistance buried electrode layers 303D and 303S are formed in such manner that said buried electrode layers 303D lead the buried electrode layers 301D up to the surface of the inter-layer insulation film 204B, and said buried electrode layer 303S leads the buried electrode layer 301S up to the surface of the inter-layer insulation film 204B. Further, the buried electrode layer 303S is formed in a stripe-like shape in conformity with the shape of the contact hole 302S and thus functions as a low-resistance common source wire.

Figure 35:
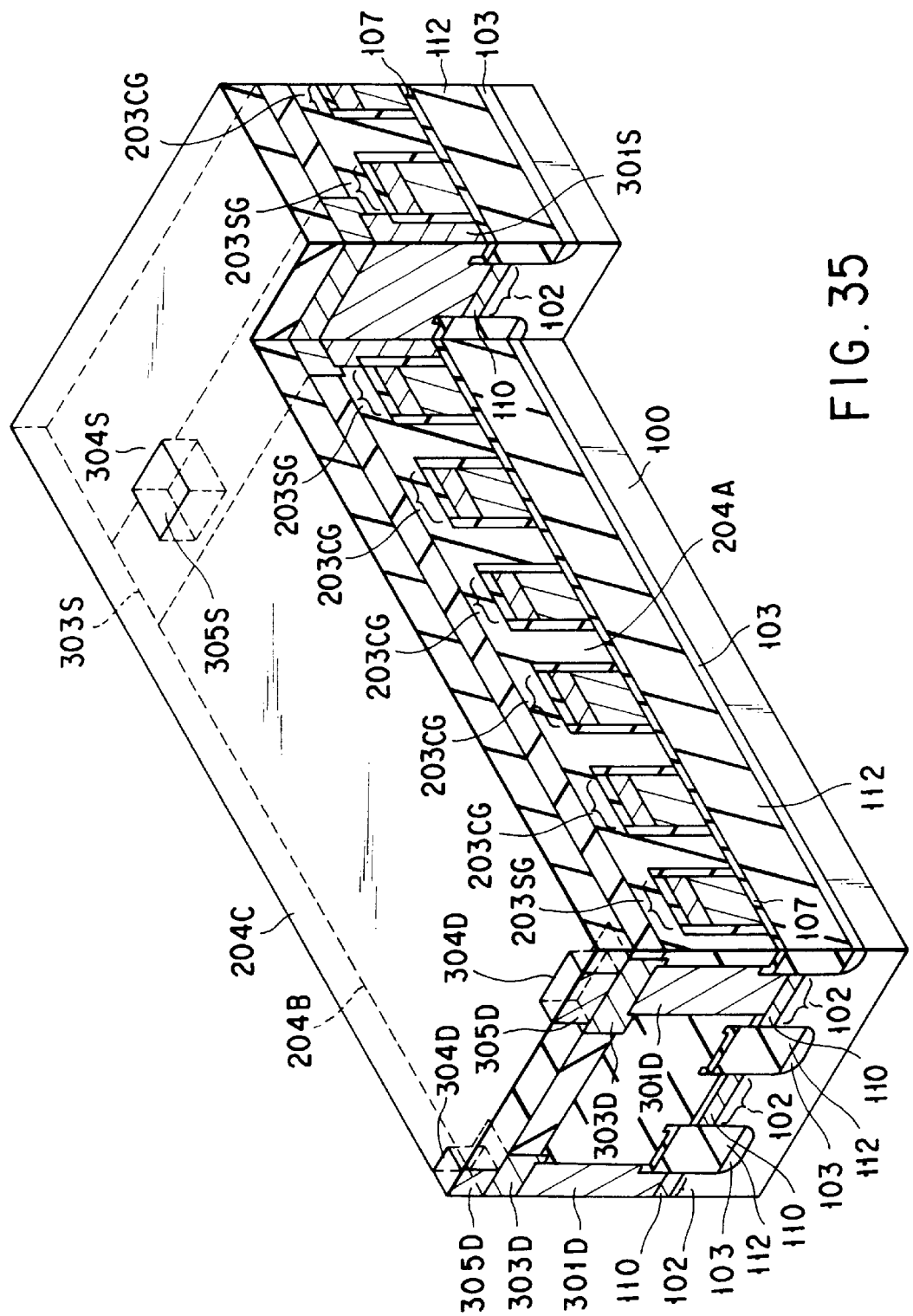

Next, as shown in FIG. 35, on the inter-layer insulation film 204B and the exposed surfaces of the buried electrode layers 303D and 303S, a third inter-layer insulation film 204C composed of for instance silicon dioxide is formed. Subsequently, contact holes 304D which lead to the buried electrode layers 303D and a contact hole 304S which leads to the buried electrode layer 303S are formed in the inter-layer insulation film 204C, respectively. In this case, the contact holes 304D are formed in the portions in which the bit lines are disposed. Further, the contact hole 304S is formed in the portion in which the source lines are disposed.

Subsequently, the interiors of the contact holes 304D and 304S are filled up with a material such as, e.g. an electrically conductive silicon, respectively. In this way, the buried electrode layers 305D which lead the buried electrode layers 303D up to the bit line contact position on the surface of the inner-layer insulation film 204C and the buried electrode layer 305S which leads the buried electrode layer 303S up to the source line contact position on the surface of the inter-layer insulation film 204C are formed.

Figure 36:
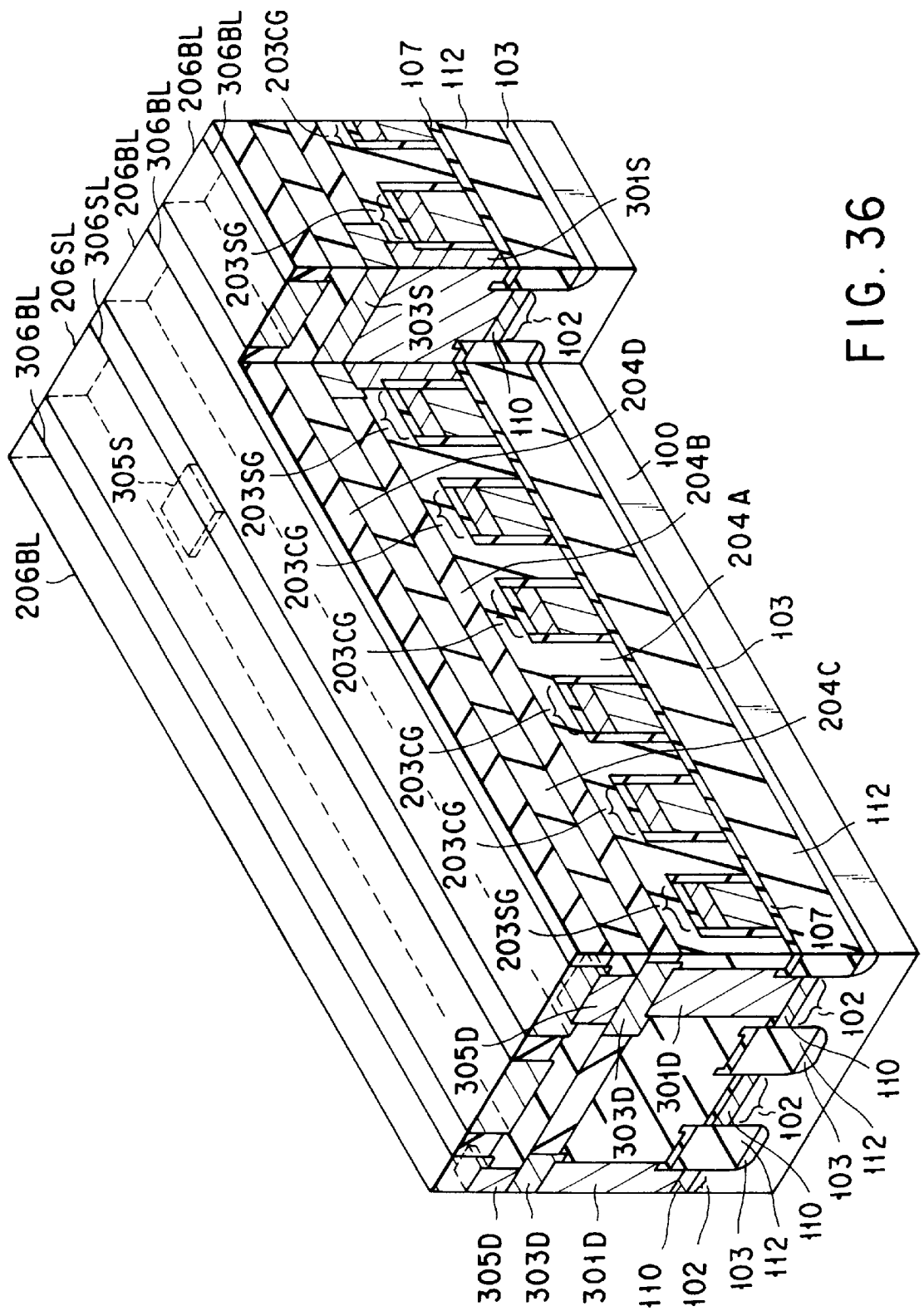

Next, as shown in FIG. 36, on the inter-layer insulation film 204C and the exposed surfaces of the buried electrode layers 305D and 305S, a fourth inter-layer insulation film 204D composed of, e.g. silicon dioxide is formed. Subsequently, in the inter-layer insulation film 204D, bit line burying holes 306BL and a source line burying hole 306S are formed, said holes 306BL and 306SL extending in a stripe-like shape in the direction perpendicular to the laminated gate structures 203 and exposing the buried electrode layers 305D and 305S, respectively.

Subsequently, the interiors of the contact holes 306BL and 306SL are filled up with a low-resistance metal such as, e.g. tungsten. Thus, bit lines 206BL connected to the buried electrode layers 305D and a source line 206SL connected to the buried electrode 305S and extending in parallel with the bit lines 206BL are formed, with which the memory array of an NAND type EEPROM is completed.

Also in the case of the above-described EEPROM manufacturing method according to the third embodiment of the present invention, as shown particularly in FIG. 29, the ONO film 107 and the polycrystalline silicon film 108A are left on the surfaces of the buried members 112 as in the cases of the first and second embodiments. As a result, when the laminated gate structures 203CG and 203SG are being processed for formation, the surfaces of the buried members 112 become hard to recede between all the gates positioned between the mutually adjacent laminated gate structures 203CG and 203SG, and thus, the occurrence of "film decrease or loss" is suppressed.

Further, in the case of the third embodiment, as shown particularly in FIG. 32, there is formed the stripe-shaped contact hole 205S in which the regions 110 isolated from each other by the element isolation region 112 and each function as a source are connected to each other on the element isolation region 112. In the interior of this stripe-shaped contact hole 205S, the surfaces of the element isolation regions 112 are exposed. Even when such a contact hole 205S is formed, the ONO film 107 is left on the surfaces of the element isolation regions (buried members) 112, whereby the occurrence of "film decrease or loss" can be suppressed.

As a result, the buried electrode layer 301S connecting together the source regions which are formed in the stripe-shaped contact hole 205S and divided by the element isolation regions 112 passes or extends, in the contact hole 205S, above the element isolation regions 112. However, the "film decrease or loss" of the element isolation regions 112 is suppressed by the ONO film 107, so that the insulation between the semiconductor substrate 100 and the buried electrode 301S can be sufficiently secured.

Due to these advantageous points, the state of an "insufficient burying" becomes hard to occur when, for instance, the inter-layer insulation film 204A is buried in. Further, the side faces of the element regions (active regions) 102 can be surely protected by the buried members 112, and thus, it is ensured that, for instance when the polycrystalline silicon film 106 is being etched, the substrate 100 is not etched. Further, the insulation between the semiconductor substrate 100 and the buried electrode 301S is never impaired.

Therefore, according to the third embodiment, NAND type EEPROMs which have fine trench type element isolation regions, and in which the element isolation regions 112 are formed in a stripe-like shape unlike in the case of, e.g. the first embodiment in which the element isolation regions 112 are formed in a lattice-like shape, whereby the NAND type EEPROM with an improved fine processability can be manufactured at a good yield. Further, as for the structure according to the third embodiment, the protection of the side faces of the element regions 102 by the buried members 112 can be more ensured—as compared with the conventional technique—as in the case of the first embodiment, so that the reliability of the EEPROMs is enhanced.

(Fourth Embodiment)

Next, a fourth embodiment of the present invention will be described.

In the fourth embodiment, the present invention is applied to an NAND type EEPROM as in the case of the third embodiment. The only difference of the former from the latter lies in the makeup of the selection gate structures included in the laminated gate structures.

FIGS. 37 to 42 are, respectively, perspective views which show the steps of the method for manufacturing the memory cells of an FETMOS type EEPROM by the use of the self-aligning trench element isolation technique according to the fourth embodiment of the present invention.

Figure 37:
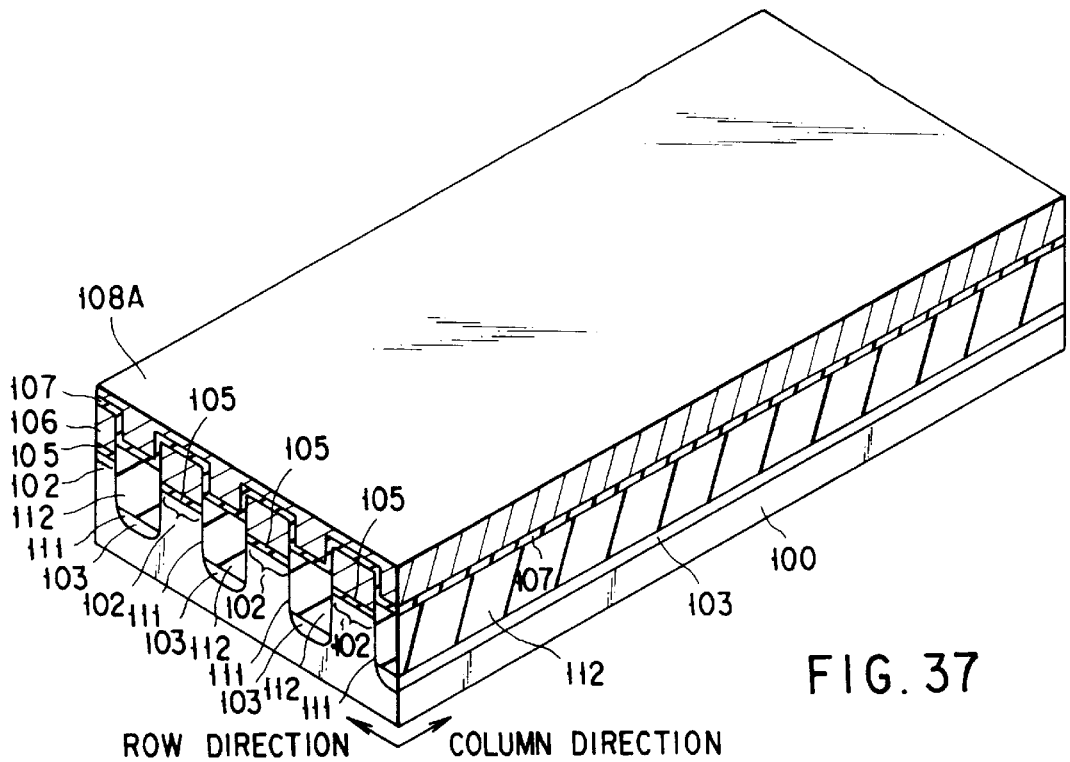
FIGS. 37 to 42 are, respectively, perspective views which show in due order the steps of manufacturing the EEPRPM according to a fourth embodiment of the present invention.

First, as shown in FIG. 37, trenches 111 are formed in accordance with the manufacturing method described above by reference to FIGS. 25 to 27; and, after the trenches 111 are filled up with buried members 112, a silicon oxide film ($SiO_2$), a silicon nitride film ($Si_3N_4$) and a silicon oxide film ($SiO_2$) are successively laminated on the buried members 112 and the polycrystalline silicon film 106, thus forming a laminated ONO film 107 which will later become an inter-layer insulation film (a second gate insulation film) insulating the floating gate and the control gate from each other. Then, on the ONO film 107, a polycrystalline silicon is deposited to form an electrically conductive polycrystalline silicon film 108A which will later become the control gate.

Figure 38:
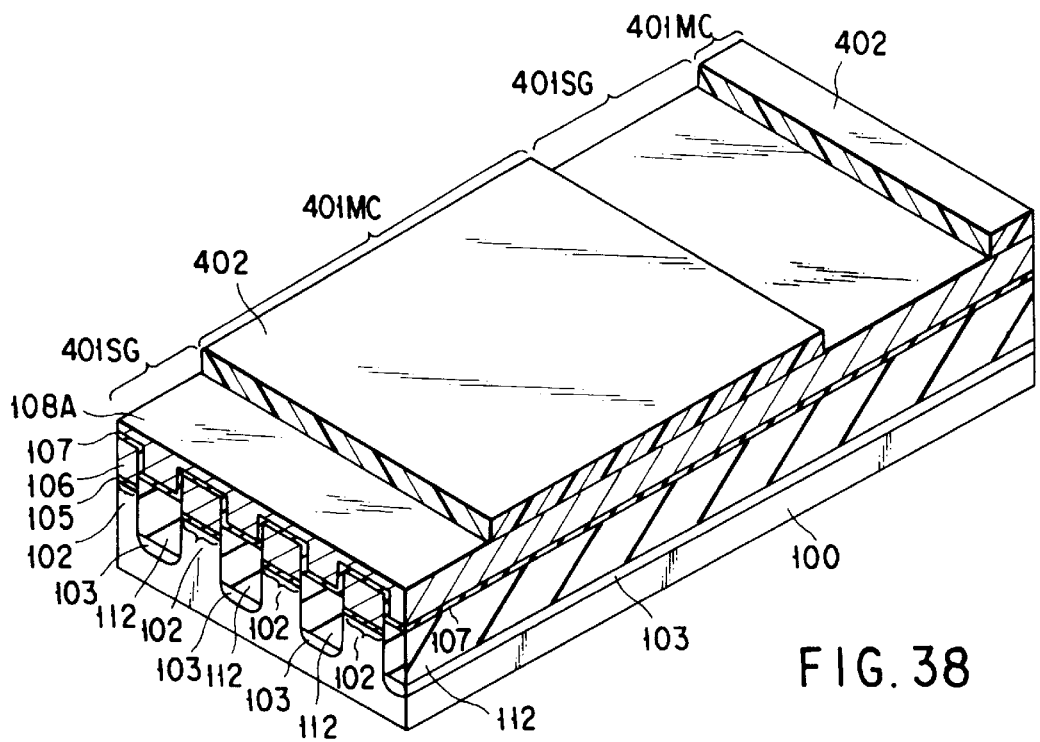

Next, as shown in FIG. 38, a photo resist is applied onto the polycrystalline silicon film 108A. Subsequently, in the thus applied photo resist film, windows are formed which (windows) correspond to regions 401SG in which the selection gates of the memory cell arrays will be formed, and there is also formed a photo resist pattern 402 covering the upper surfaces of regions 401MC in which the memory cells of the memory cell array will be formed.

Figure 39:
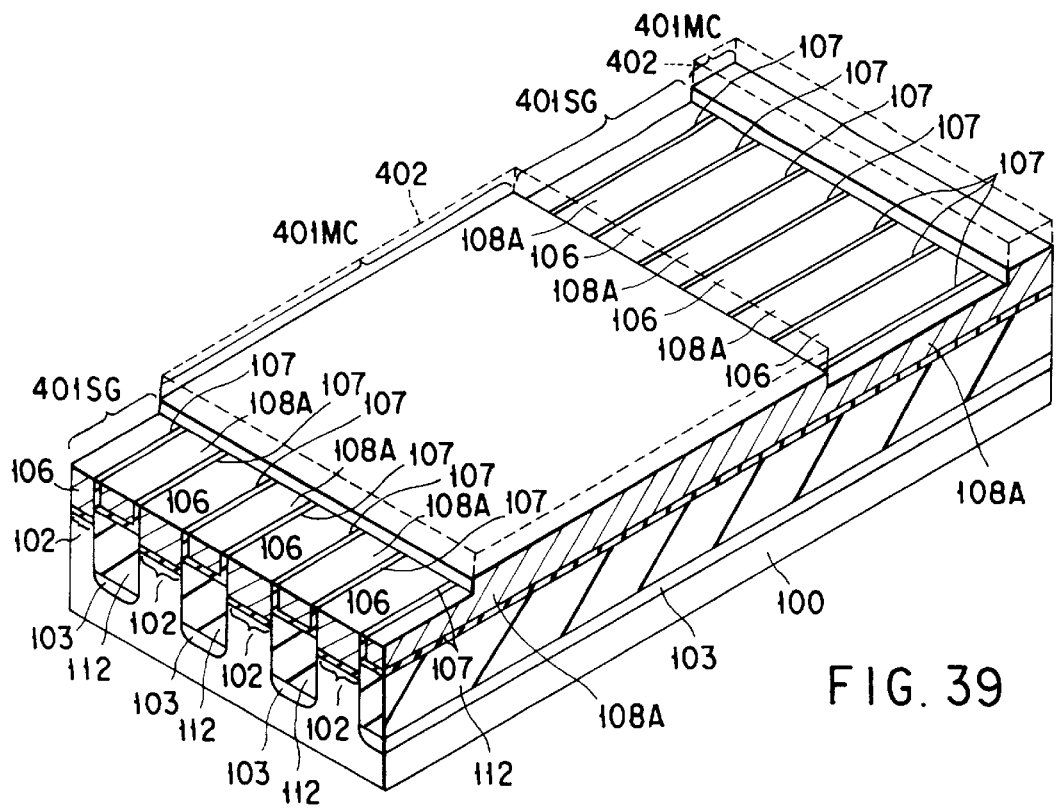

Next, as shown in FIG. 39, by the use of the photo resist pattern 402 as a mask, the polycrystalline silicon film 108A and the ONO film 107 are etched, so that, in the regions 401SG in which the selection gates will be formed, the surfaces of the polycrystalline silicon films 106 which will become the floating gates are exposed. Through this etching operation, the polycrystalline silicon film 108A and the ONO film 107 are left on the buried members 112 between of the polycrystalline silicon films 106.

Figure 40:
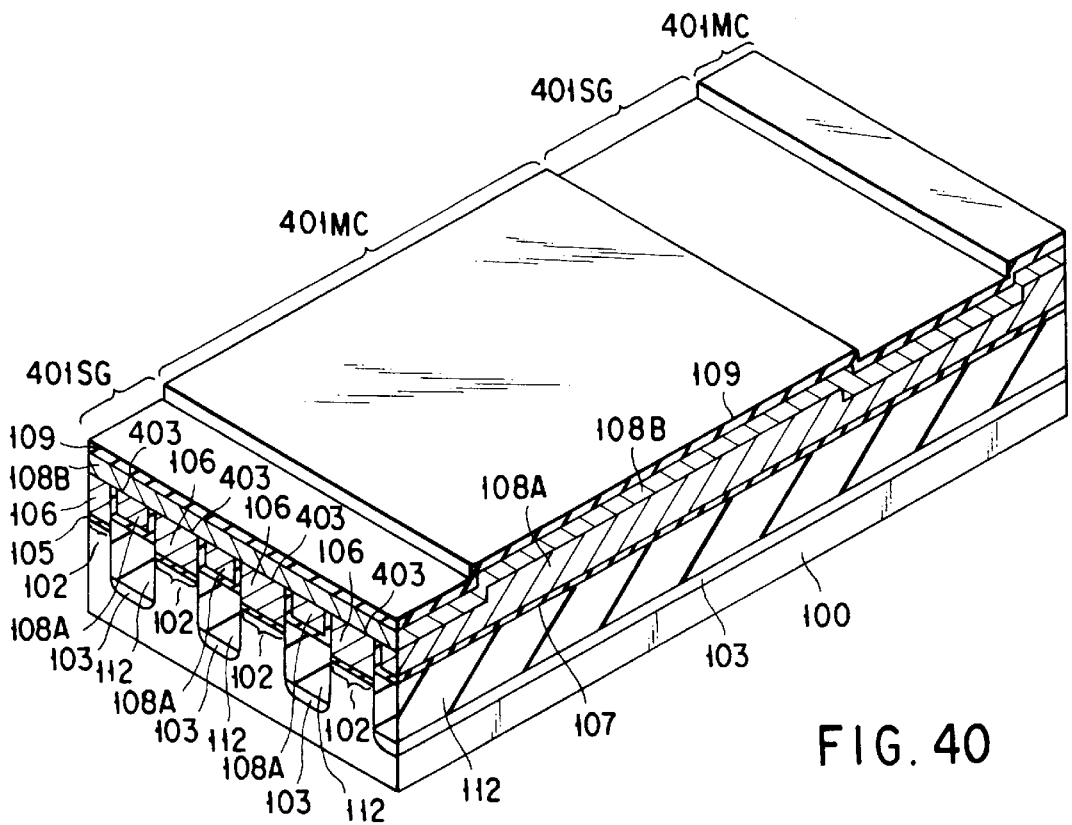

Next, as shown in FIG. 40, after the photo resist pattern 402 is removed, a metal film 108B having a resistance lower than that of the polycrystalline silicon is formed on the thus exposed polycrystalline silicon film 106 and the polycrystalline silicon film 108A, whereby a polymetal structure which is a laminated structure consisting of polycrystalline silicon and metal is formed. The metal film 108B is composed of for instance tungsten (W). In this case, the metal film 108B is directly contacted with the polycrystalline silicon film 106 as indicated by the reference numeral 403 in FIG. 40.

Subsequently, on the metal film 108, a cap layer 109 is formed. The cap layer 109 serves as a mask when a self-aligning contact using the laminated gate structures is effected, and, as the material of said cap layer 109, a material which is different in etching rate from that of the inter-layer insulation film in which the contact holes are formed. For instance, in case the inter-layer insulation film is composed of a silicate glass series material, the cap layer 9 is comprised of for instance a silicon nitride film ($Si_3N_4$).

Figure 41:
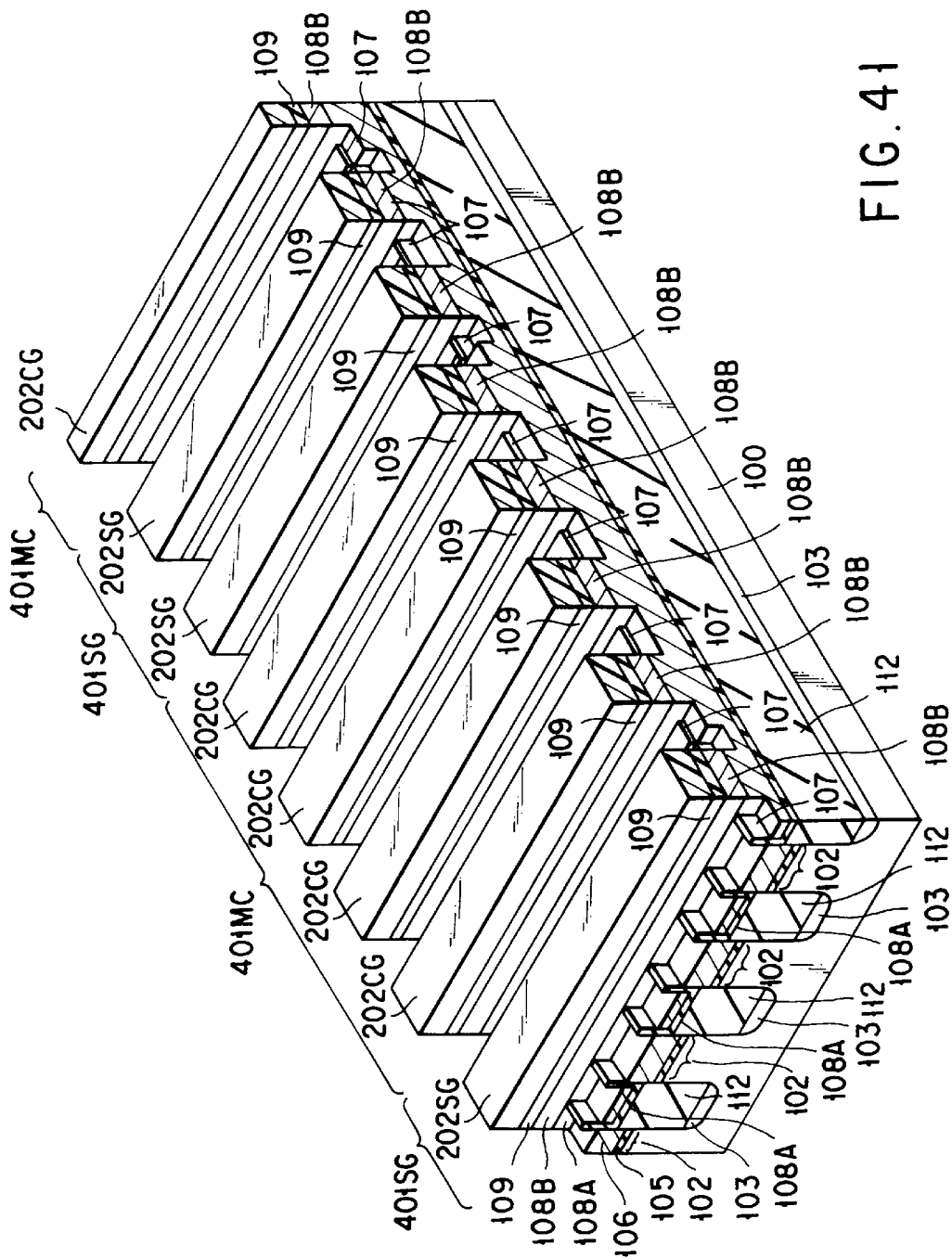

Next, as shown in FIG. 41, onto the cap layer 109, a photo resist is applied to form a photo resist layer. Subsequently, the photo resist layer is patterned into control gate patterns 202CG and selection gate patterns 202SG.

Subsequently, by the use of the patterns 202CG and 202SG as a mask, the cap layer 109, the metal film 108B and the polycrystalline silicon film 108A are anisotropically etched. In this case, the cap layer 109, the metal film 108B and the polycrystalline films 108A are completely removed from above the polycrystalline film 106, but, on or above the buried members 112, portions of the polycrystalline film 108A are left. Located above the buried members 112 are the opening portions formed in the polycrystalline silicon film 106.

These opening portions each function also as a "slit" which will later separates the floating gate in the direction extending along the control gate. Thus, it follows that, in each "slit" which will later separate the floating gate in the direction along the control gate, a portion of the polycrystalline silicon film 108A which will later constitute the control gate is left.

Further, in this embodiment, the manufacturing method using the self-aligning trench element isolation technique is referred to, but, also in case the present invention is applied to an EEPROM which has different trench type element isolation regions or an EEPROM which has LOCOS type element isolation regions, a portion of the polycrystalline film 108A which will later become the control gate or constitute the control gate is likewise left in each "slit" which will later separate the floating gate in the direction extending along the control gate.

Figure 42:
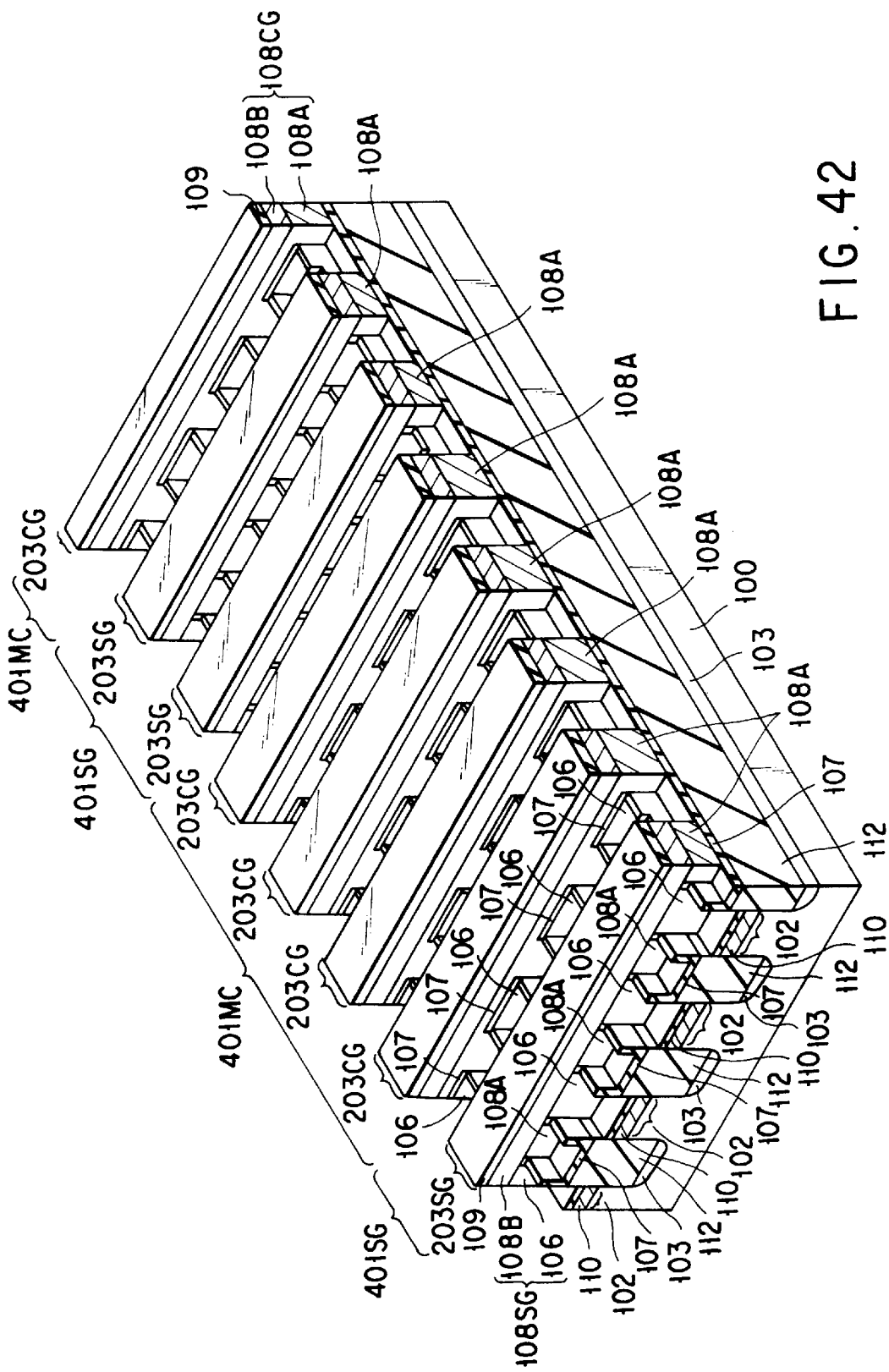

Next, as shown in FIG. 42, in regions 401C in which the memory cells are formed, the ONO film 107 is anisotripically etched, whereby the upper surface and portions of the side surfaces of the polycrystalline silicon film 106 are exposed. In this case, the left portions of the polycrystalline film 108A serve as a mask, so that the surfaces of the buried members 112 are never etched.

Due to this, the surfaces of the buried members 112 are free from partial recession; and thus, the occurrence of a "film decrease or loss" is suppressed. As a result of the occurrence of a "film decrease or loss" being thus suppressed, the thickness of the buried members 112 can be maintained at the thickness value prescribed at the step shown in FIG. 27 pertaining to the third embodiment, and the designed structure is reproduced more faithfully to the actual structure.

Subsequently, the polycrystalline silicon film 106 and the left portions of the polycrystalline silicon film 108A are ansiotropically etched. Thus, the portions of the polycrystalline silicon film 106 existing under the control gate patterns 202CG are cell-wise divided for the respective memory cells, thus assuming the shape of floating gates 106. At the same time, the ONO films 107 each assume the shape of inter-layer insulation films 107 which each insulates the floating 106 and the control gate 108 from each other.

Further, the portions of the polycrystalline silicon film 106 existing under the selection gate patterns 202SG are each connected to the metal film 108B, thus assuming the shape of an ordinary MOSFET type gate. Further, the polycrystalline silicon film 108A and the metal film 108B which exist under the control gate patterns 202CG are row-wise divided for the respective rows of the memory cell array, becoming control gates 108CG. In this way, laminated gate structures 203CG for control gates are completed which each comprise the control gate 108CG, the inter-layer insulation film 107, and the floating gate 106 and each have its upper surface coated by the cap layer 109.

At the same time, the polycrystalline silicon layer 108A and the metal film 108B which exist under the selection gate pattern 202SG are divided into portions for the respective selection gates of the memory cell array, and the metal film 108B on the element region 102 is connected to the polycrystalline silicon film 106, assuming the shape of selection gates 108CG, with which laminated gate structures 203SG for selection gates which structures each include the selection gate 108CG and have its upper surface coated by the cap layer 109 are completed.

Subsequently, after or before the removal of the patterns 202CG and 202SG, a donor such as phosphorus is injected into the substrate 100 by ion implantation by the use, as a mask, of the laminated gate structures 203CG and 203SG and the element isolation regions 112, whereby n+ type source and drain regions 110 are formed.

Further, though not shown by the use of drawings, the memory cell array of an NAND type EEPROM is completed in such a manner that, in accordance with the manufacturing method already described by reference to FIGS. 31 to 36, side wall spacer films 109S are formed on the side walls of the laminated gate structures 203CG and 203SG, and thereafter, the bit lines 206BL and the source lines 206SL are formed by the use of the self-aligning contact technique and the wiring burying technique.

In the case of the above-described EEPROM manufacturing method according to the fourth embodiment, particularly as shown in FIG. 41, the ONO films 107 and the polycrystalline silicon film 108A are left on the surfaces of the buried members 112 as in the case of the first to third embodiments, so that it is possible to obtain the merit that the occurrence of "film decrease or loss" of the buried members 112 can be suppressed as in the case of said first to third embodiments.

Further, in the case of the fourth embodiment, as shown particularly in FIG. 39, in the regions 401SG in which the selection gates are formed, the polycrystalline silicon film 108A is etched to expose the surface of the polycrystalline silicon film 106. Due to this, in the regions 401SG, the metal film 108B is directly connected to the polycrystalline silicon film 106. As a result, it is possible to form, in the regions 401SG, ordinary type MOSFETs which differ from the floating gate type MOSFETs formed in the regions 401MC in which the memory cells are formed. That is, according to the fourth embodiment, the merit is obtained that the selection gate transistors can be comprised of ordinary type MOSFETs.

Further, in the above-described third embodiment, the selection gate transistors are comprised of floating gate type MOSFETs as in the case of the memory cell transistors, but it does not result in any particular inconvenience. Because, in this case, it suffices if only a potential sufficient to allow the conduction of the floating gate type MOSFETs.

Therefore, according to the fourth embodiment, it is possible to manufacture at a good yield NAND type EEPROMs constituted in such a manner that they have fine trench type element isolation regions, and the element isolation regions 112 are each formed in a stripe-like shape unlike in the case of, e.g. the first embodiment having element isolation regions formed in a lattice-like shape, whereby the fine processability workability is improved. Further, as for the structure of said NAND type EEPROM, the protection of the side faces of the element regions 102 by the buried members 112 is more ensured as compared with the conventional technique as in the case of the first embodiment, and thus, the reliability of ERPROMs is also enhanced.

In the above, the present invention has been described by taking for example NOR type EEPROMs and NAND type EEPROMs, but the application of the present invention is not limited only to the NOR type and NAND type EEPROMs, but the present invention can also be applied to the other types of EEPROMs.

The tunnel oxide film 105 may be comprised of not only silicon dioxide but also, e.g. a silicon oxide/nitride film composed by nitriding the surface of a silicon dioxide film.

The electrically conductive silicon film 106 may alternatively be comprised of an electrically conductive amorphous silicon film.

The ONO film 107 may either be a single layer composed of silicon oxide film ($SiO_2$) or silicon nitride film ($Si_3N_4$), or may be a silicon oxide/nitride film (SiON or a silicon dioxide film with its surface nitrided), or an ON film or an NO film consisting of a silicon oxide film ($SiO_2$) and a silicon nitride film ($Si_3N_4$), or may be composed of even other insulating material.

The electrically conductive polycrystalline silicon film 108A may alternatively be an electrically conductive amorphous silicon film.

The metal film 108B may be composed of not only tungsten but also another refractory metal such as molybdenum (Mo). Further, the metal film 108B may be composed of, e.g. tungsten silicide (WSi) or molybdenum silicide (MoSi) so as to constitute a polycide structure which is a laminated structure formed of polycrystalline silicon and silicide. Further, the metal film 108B may be composed of titanium (T) or cobalt (Co), so that said metal is subjected to high-temperature treatment for a short while to form a silicide structure comprising silicide selectively grown on the polycrystalline silicon.

Further, in the first and second embodiments, the surface of the polycrystalline silicon film 108A is flattened in order to make it easy to leave the polycrystalline silicon film 108A on the buried members 112, but the surface of the polycrystalline silicon film 108A need not necessarily be flattened.

Further, it is alternatively possible to form no metal film 108B but form the control gate of only one layer of electrically conductive polycrystalline silicon 108A.

As has been described above, according to the present invention, a non-volatile semiconductor memory device constituted in such a manner that the surfaces of the element isolation regions are not subjected to "film decrease or loss" and a method for the manufacture of said memory device can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:

a semiconductor substrate;

a plurality of semiconductor active regions formed in said semiconductor substrate, in a state isolated from each other;

a plurality of insulative element isolation regions which are formed between said plurality of semiconductor active regions, respectively;

a source region and a drain region formed in each of said plurality of semiconductor active regions, said source region and said drain region being located apart from each other;

a first gate insulation film formed in said plurality of semiconductor active regions between said source region and said drain region;

a charge storage layer which capacitively couples, through said first gate insulation film, to said corresponding one of said plurality of semiconductor active region and said drain region;

a second gate insulation film formed at least on said charge storage layer; and a control gate which capacitively couples to said charge storage layer through said second gate insulation film, wherein said control gate extends, above said plurality of semiconductor active regions adjacent to each other, over said plurality of insulative element isolation regions, and said second gate insulation film formed on said charge storage layer extends to an upper surface of said plurality of insulative element isolation regions lying under said control gate and to an upper surface of said plurality of insulative element isolation regions other than said upper surface of said plurality of insulative element isolation regions lying under said control gate.

2. The non-volatile semiconductor memory device according to claim 1, wherein each of said plurality of insulative element isolation regions is a trench type element isolation region.

3. The non-volatile semiconductor memory device according to claim 1, wherein a position of said upper surface of each of said plurality of insulative element isolation regions is located at a position lower than an upper surface of said charge storage layer which lies above said plurality of semiconductor active regions and higher than an interface between said charge storage layer and said first gate insulation film.

4. The non-volatile semiconductor memory device according to claim 1, wherein a surface of said control gate extending above said plurality of semiconductor active regions is flattened.

5. The non-volatile semiconductor memory device according to claim 1, wherein said control gate comprises a laminated structure formed of a first electrically conductive layer composed of a first electrically conductive material and of a second electrically conductive layer composed of a second electrically conductive material having a resistance lower than that of said first electrically conductive material, and a surface of said first electrically conductive layer is flattened.

6. The non-volatile semiconductor memory device according to claim 1, wherein said device comprises:

a plurality of diffused regions formed in said plurality of semiconductor active regions, respectively, and an electrode layer extending on the predetermined number of said diffused regions adjacent to each other, over corresponding regions of said plurality of insulative element isolation regions, and electrically connecting said predetermined number of said diffused regions with each other, and wherein said second gate insulation film is formed between said corresponding one of said plurality of insulative element isolation regions and said electrode layer.

7. The non-volatile semiconductor memory device according to claim 6, wherein said electrode layer constitutes a source line.

8. A non-volatile semiconductor memory device comprising:

a semiconductor substrate;

a plurality of semiconductor active regions formed, in said semiconductor substrate, in a state isolated from each other;

a plurality of insulative element isolation regions which are formed between said plurality of semiconductor active regions, respectively;

a source region and a drain region formed in each of said plurality of semiconductor active regions, said source region and said drain region being located apart from each other;

a first gate insulation film formed on said plurality of semiconductor active regions between said source region and said drain region;

a charge storage layer which capacitively couples, through said first gate insulation film, to said corresponding one of said plurality of semiconductor active region and said drain region;

a second gate insulation film formed at least on said charge storage layer;

a control gate which capacitively couples to said charge storage layer through said second gate insulation film, said control gate extending, above a predetermined number of said semiconductor active regions adjacent to each other, over corresponding regions of said plurality of insulative element isolation regions, wherein, with reference to an upper surface of said plurality of insulative element isolation regions, a following relationship holds among a height "IIa" of a portion of said upper surface excluding a portion thereof lying beneath said control gate, a height "Hb" of a portion of said upper surface lying beneath said control gate, and a thickness "Tc" of said second gate insulation film:

Hb−Ha<Tc.

9. The non-volatile semiconductor memory device according to claim 8, wherein each of said plurality of insulative element isolation regions is a trench type element isolation region.

10. The non-volatile semiconductor memory device according to claim 8, wherein a position of said supper surface of each of said plurality of insulative element isolation regions is located at a position lower than an upper surface of said charge storage layer which lies above said plurality of semiconductor active regions and higher than an interface between said charge storage layer and said first gate insulation film.

11. The non-volatile semiconductor device according to claim 8, wherein a surface of said control gate extending above said plurality of said semiconductor active regions is flattened.

12. The non-volatile semiconductor device according to claim 8, wherein said control gate comprises a laminated structure formed of a first electrically conductive layer composed of a first electrically conductive material and a second electrically conductive layer composed of a second electrically conductive material having a resistance lower than that of said first electrically conductive material, and a surface of said first electrically conductive layer is flattened.

13. A non-volatile semiconductor memory device comprising:

a semiconductor substrate;

a plurality of semiconductor active regions formed in said semiconductor substrate, in a state isolated from each other;

a plurality of insulative element isolation regions which are formed between said plurality of semiconductor active regions, respectively;

a source region and a drain region formed in each of said plurality of semiconductor active regions, said source region and said drain region being located apart from each other; and a first and a second gate line, each having a first gate insulation film formed on said plurality of semiconductor active regions between said source region and said drain region, a charge storage layer formed on said first gate insulation film, a second gate insulation film formed on said charge storage layer, and a control gate formed on said second gate insulating film, said first and said second gate line extending on and being perpendicular to said plurality of semiconductor active regions and said plurality of insulative element isolation regions, and said second insulating film extending on said insulative element isolation regions in an area between said first and said second gate lines.

14. The non-volatile semiconductor memory device according to claim 13, wherein each of said plurality of element isolation regions is a trench type element isolation region.

15. The non-volatile semiconductor memory device according to claim 14, wherein a position of said upper surface of each of said plurality of element isolation region is located at a position lower than an upper surface of said charge storage layer which lies above said plurality of semiconductor active regions and higher than an interface between said charge storage layer and said first gate insulation film.

16. The non-volatile semiconductor memory device according to claim 14, wherein a surface of said control gate extending above said plurality of semiconductor active regions is flattened.

17. The non-volatile semiconductor memory device according to claim 14, wherein said control gate comprises a laminated structure formed of a first electrically conductive layer composed of a first electrically conductive material and of a second electrically conductive layer composed of a second electrically conductive material having a resistance lower than that of said first electrically conductive material, and a surface of said first electrically conductive layer is flattened.

18. The non-volatile semiconductor memory device according to claim 14, wherein said device comprises:

a plurality of diffused regions formed in said plurality of semiconductor active regions, respectively, and an electrode layer extending on a plurality of said diffused regions adjacent to each other, over corresponding regions of said plurality of element isolation regions, and electrically connecting said predetermined number of said diffused regions with each other, and wherein said second gate insulation film is formed between said corresponding one of said plurality of element isolation regions and said electrode layer.

19. The non-volatile semiconductor memory device according to claim 18, wherein said electrode layer constitutes a source line.

* * * * *

UNITED STATES PATENT AND TRADEMARK OFFICE
CERTIFICATE OF CORRECTION

PATENT NO.: 6,060,740

DATED: May 9, 2000

INVENTORS: Kazuhiro SHIMIZU, *et al.*

It is certified that errors appear in the above-identified patent and that said Letters Patent is hereby corrected as shown below:

On the title page item

[75] Inventors, "Kauhito" has been replaced with --Kazuhito--.

Claim 10, column 29, line 23, "supper" has been replaced with --upper--.

Signed and Sealed this

Third Day of April, 2001

*Attest:*

NICHOLAS P. GODICI

*Attesting Officer*   *Acting Director of the United States Patent and Trademark Office*